(12) United States Patent
Kuroda

(10) Patent No.: US 8,574,963 B2
(45) Date of Patent: Nov. 5, 2013

(54) METHOD OF MANUFACTURING SEMICONDUCTOR DEVICE

(75) Inventor: Hiroshi Kuroda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 106 days.

(21) Appl. No.: 13/196,171

(22) Filed: Aug. 2, 2011

(65) Prior Publication Data

US 2012/0052628 A1  Mar. 1, 2012

(30) Foreign Application Priority Data

Aug. 31, 2010  (JP) ................................. 2010-193161

(51) Int. Cl.
*H01L 21/00* (2006.01)

(52) U.S. Cl.
USPC .......................................... 438/118; 438/126

(58) Field of Classification Search
CPC ............................... H01L 21/52; H01L 21/563
USPC ......... 438/108, 110, 112, 118, 124, 126, 127; 257/782, 783, 785, E23.001, E23.004, 257/E23.018
See application file for complete search history.

(56) References Cited

U.S. PATENT DOCUMENTS

| 7,015,069 B2 | 3/2006 | Takahashi et al. | |
|---|---|---|---|
| 2005/0127535 A1* | 6/2005 | Takahashi et al. | 257/787 |
| 2008/0188058 A1* | 8/2008 | Nishimura et al. | 438/455 |

FOREIGN PATENT DOCUMENTS

| JP | 2002-190488 A | 7/2002 |
|---|---|---|
| JP | 2008-218848 A | 9/2008 |

* cited by examiner

*Primary Examiner* — Khiem D Nguyen
(74) *Attorney, Agent, or Firm* — Mattingly & Malur, PC

(57) ABSTRACT

Occurrence of a void is suppressed when mounting semiconductor chips over a wiring substrate via a paste-like adhesive material. A die bonding step is provided which mounts semiconductor chips over a chip-mounting region of the wiring substrate via the adhesive material. The wiring substrate includes a plurality of wirings (first wirings) and dummy wirings (second wirings) formed on an upper surface of a core layer. The chip-mounting region is provided over the first wirings and the second wirings. In addition, the die bonding step includes a step of applying the adhesive material over an adhesive material application region over the chip-mounting region. Each of the second wirings is extended along a direction in which the adhesive material spreads in the die bonding step.

14 Claims, 32 Drawing Sheets

METHOD OF MANUFACTURING SEMICONDUCTOR DEVICE

CROSS-REFERENCE TO RELATED APPLICATION

The disclosure of Japanese Patent Application No. 2010-193161 filed on Aug. 31, 2010 including the specification, drawings and abstract is incorporated herein by reference in its entirety.

BACKGROUND

The present invention relates to a technology of manufacturing semiconductor devices, and particularly to a technology which can be effectively applied to a step of mounting a semiconductor chip over a wiring substrate.

Japanese Patent Laid-Open No. 2002-190488 (Patent Document 1) describes a semiconductor device which mounts a semiconductor chip over a wiring substrate, and in which a wiring conductor pattern and a dummy conductor pattern laid in a region other than the region having the wiring conductor pattern laid therein are provided.

Japanese Patent Laid-Open No. 2008-218848 (Patent Document 2) describes a semiconductor device which mounts a semiconductor chip over a wiring substrate via an adhesive film, and in which a real wiring pattern and a dummy pattern are provided in a chip-mounting region of the wiring substrate.

There is a mounting technology that uses a paste-like adhesive material (die bonding material), as a manufacturing technology of a semiconductor device having a semiconductor chip mounted over a wiring substrate. Inventors of the present invention have examined the technology of mounting a semiconductor chip over a wiring substrate via the paste-like adhesive material and found the following problems.

As a semiconductor device becomes thinner, semiconductor chips to be mounted on a wiring substrate also tend to be thinner. If an excessive amount of the paste-like adhesive material is used when mounting such a thin semiconductor chip over a wiring substrate, a part of the adhesive material running over the circumference of the semiconductor chip may crawl up to the surface of the semiconductor chip (the opposite side of the surface facing the wiring substrate). As a countermeasure thereof, reducing the amount of the adhesive material used may be considered. However, a plurality of wirings is formed on the upper surface of the wiring substrate (the surface on which the semiconductor chip is mounted), the flatness of the upper surface is low because there exist regions where the pitch between adjacent wirings is uneven. Accordingly, it has become clear that a void (gap) occurs between the semiconductor chip and the wiring substrate because wettability (filling property) of the adhesive material between the semiconductor chip and the wiring substrate is low (poor).

Next, inventors of the present application have examined enhancement of the flatness of the wiring substrate by forming a dummy pattern in the upper surface of the wiring substrate, as described in the patent documents 1 and 2. As a result, it has been confirmed that the flatness of the upper surface of the wiring substrate can be improved by providing a dummy pattern in contrast to the case where no dummy pattern is provided. However, as described above, recent semiconductor chips are much thinner than those at the time when the above patent documents were filed, and accordingly the amount of the adhesive material used is further reduced. Consequently, with the manufacturing method of semiconductor device as described above, it has become clear that occurrence of a void cannot be completely suppressed by simply forming a dummy pattern over the wiring substrate.

The present invention has been made in view of the above circumstances and provides a technology that can suppress occurrence of a void when mounting a semiconductor chip over a wiring substrate via a paste-like adhesive material.

The above and other objects and new features of the present invention will become clear from the description of the specification and accompanying drawings.

SUMMARY

The following explains briefly the outline of a typical invention among the inventions disclosed in the present application.

Specifically, a method of manufacturing a semiconductor device which is an aspect of the present invention includes a die bonding step of mounting a semiconductor chip over a chip-mounting region of a wiring substrate via a flowable adhesive material. Here, the wiring substrate has a plurality of first and second wirings formed on an upper surface of a core layer, a plurality of bonding leads formed on the upper surface of the core layer and electrically coupled to the first wirings, and an upper surface-side insulating film formed on the upper surface of the core layer to cover the first and second wirings. The chip-mounting region has the first and second wirings. In addition, the die bonding step includes a step of applying an adhesive material over an adhesive material application region over the chip-mounting region. The die bonding step also includes a step of spreading the adhesive material applied over the adhesive material application region to around the adhesive material application region. Each of the second wirings is extended along a direction in which the adhesive material spreads in the die bonding step.

The following explains briefly the effect acquired by the typical invention among the inventions disclosed in the present application.

According to an aspect of the present invention, occurrence of a void can be suppressed when mounting a semiconductor chip over a wiring substrate via a paste-like adhesive material.

Figure 1:
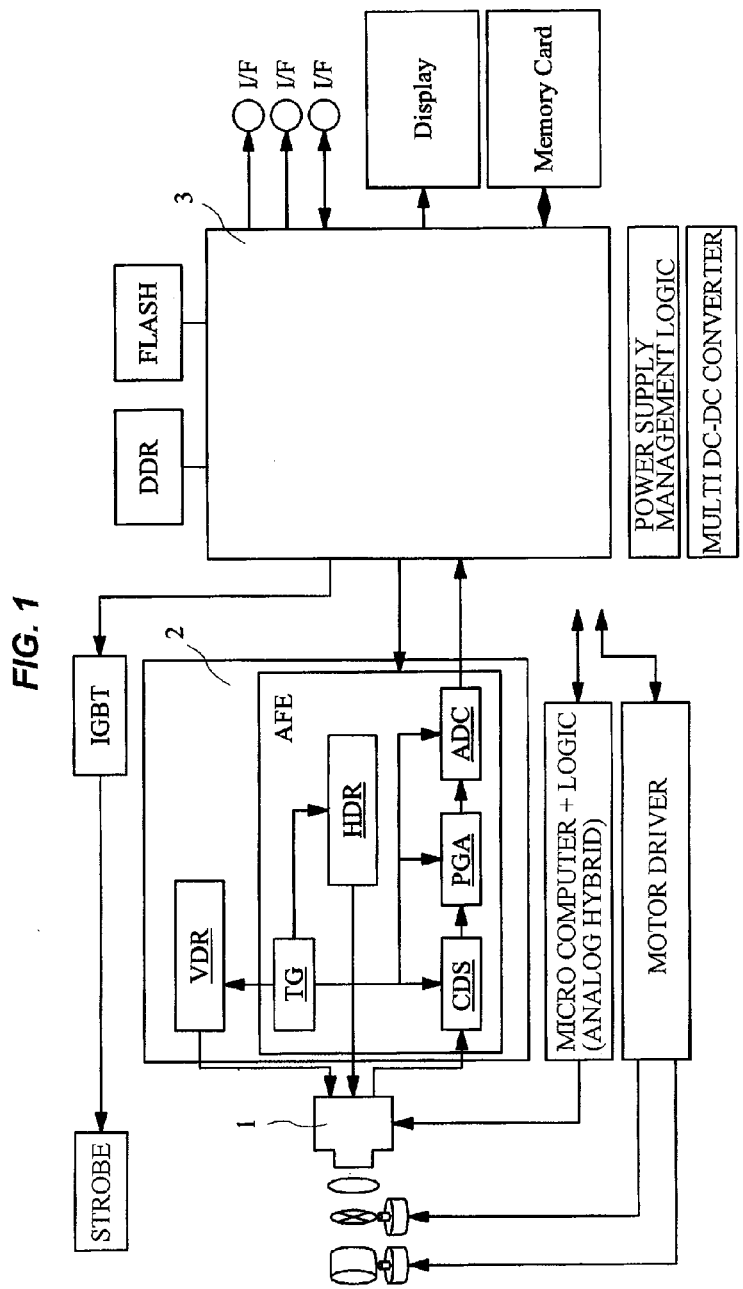
FIG. 1 is an explanatory view schematically illustrating the operation of an imaging system incorporating a semiconductor device according to an embodiment of the present invention.

DETAILED DESCRIPTION (Explanation of Description Form, Basic Terms, and Usage in the Present Application)

In this application, although the description of embodiments are divided into a plurality of sections for convenience as required, they are not independent of each other, unless otherwise explicitly specified, regardless of the order of description; the sections may be respective parts of a single example; a section may be a detailed description of another; or a section may be a partial or entire variation of another. In addition, repetitive description of similar components is omitted in principle. The ingredients in the embodiments are not essential unless otherwise explicitly specified, or theoretically limited in numbers or obviously unlimited from the context.

Similarly in the description of the embodiments, the expression "X comprising A" with regard to a material or ingredients does not exclude anything which includes components other than A, unless otherwise explicitly specified or obviously denied from the context. For example, it means "X including A as a major ingredient". For example, it is needless to say that a "silicon member" is not limited to pure silicon but may include SiGe (silicon-germanium) alloy and other multi-element alloys including silicon as the major ingredient, as well as a member including other additives or the like. It is also assumed that, unless otherwise explicitly specified, gold plate, Cu layer, or nickel plate may include a member having gold, Cu, or nickel as the major ingredient.

Furthermore, even if a particular numerical value or amount is mentioned, the numerical value may be exceeded or underrun unless otherwise explicitly specified, or theoretically limited in numbers or obviously unlimited from the context.

In the drawings of the embodiments, identical or similar components are indicated by identical or similar symbols or reference numerals, and duplicate description thereof is omitted.

In the accompanying drawings, hatching on a cross-section may be omitted where it unnecessarily adds to complication or where distinction with a space is apparent. There may also be a case that the background outline of a planarly closed hole is omitted where it is apparent from the description. Furthermore, a place other than a cross section may be provided with hatching or dot patterns to explicitly indicate that it is a space or a border of a region.

In the following embodiments, a semiconductor device incorporated in an imaging device (imaging system) specifically considered by the inventors such as a DSC (Digital still camera), a DVC (Digital video camera), or a cellular phone with a camera function will be described as an exemplary SIP-type semiconductor device.

<Imaging Device (Imaging System)>

FIG. 1 is an explanatory view schematically illustrating the operation of an imaging system incorporating a semiconductor device according to an embodiment of the present invention.

In FIG. 1, an imaging device (imaging system) according to the present embodiment comprises an imaging element (image sensor) 1 such as, for example, a CCD (Charge Coupled Device) or a CMOS (Complementary Metal Oxide Semiconductor), and a semiconductor device 2 electrically coupled to the imaging element 1. The imaging element 1 includes a photodiode which converts light into electrons, and a scanning circuit which reads the electrons as an electrical signal. In addition, the semiconductor device 2 includes an AFE (Analog Front End) circuit having a function of controlling the imaging element 1 and a function of processing the electrical signal output from the imaging element 1.

The semiconductor device 2 has a function of controlling the imaging element 1. Specifically, the semiconductor device 2 has a driver circuit which drives a timing generator TG that is a digital circuit and the imaging element 1, and drives the driver according to a control signal generated in the timing generator TG. The driver circuit drives an imaging element (imaging device having pixels arranged in an array) 1 such as a CCD sensor, for example.

To drive the imaging element 1, a drive voltage is applied by two types of driver circuits having different voltages (drive voltages). First, the timing generator TG included in an AFE circuit outputs a pulsed control signal. The control signal output from the timing generator TG uses a 3.3V power supply, for example, in the AFE circuit. In other words, a control signal of a 3.3V system is output.

A horizontal driver HDR, which is one of the two types of driver circuits having different voltages, applies a voltage to the imaging element 1 according to the control signal of the 3.3V system to drive the imaging element 1. A vertical driver VDR, which is the other driver circuit, drives the imaging element 1 according to the control signal having a higher voltage than that of the horizontal driver HDR. For example, using a 5V power supply in the present embodiment, the control signal of the 3.3V system input from the timing generator TG is converted into a control signal (5V signal) using the 5V power supply by a level shifter and is output to drive the imaging element 1.

The imaging element 1, having a plurality of photodiodes arranged in an array, converts the light irradiated to the photodiodes into an electric charge. In other words, the image projected on the photodiodes is converted into an electric charge. In the imaging device, the electric charge converted by the photodiodes is subjected to signal processing as an electrical signal, thereby displaying an image. In this occasion, the imaging element 1 has a scanning circuit provided therein for sequentially outputting electric charges from the photodiodes arranged in an array, and converts the image into an electrical signal (analog image signal) by charge transfer. Driving of the scanning circuit is controlled by a control signal (for example, a timing pulse) output from the horizontal driver HDR and the vertical driver VDR.

The electrical signal (analog image signal) output from the imaging element 1 is subjected to processing in the AFE circuit of the semiconductor device 2, such as noise removal, amplification, and A/D conversion and converted into a digital signal. For this purpose, the AFE circuit includes a noise reduction circuit CDS, an amplification circuit PGA, and an A/D conversion circuit ADC. The signal is then output to a semiconductor device 3, which is an LSI (Large Scale Integration) having an image processing circuit formed thereon, and further subjected to image processing, and subsequently displayed on a display unit or stored in a storage unit.

The semiconductor device 2 according to the present embodiment which will be described in detail below is a semiconductor device (semiconductor package) having a system which controls the imaging element 1 or a system which processes the electrical signal output from the imaging element 1, in an imaging system such as that mentioned above.

<Semiconductor Device>

Figure 2:
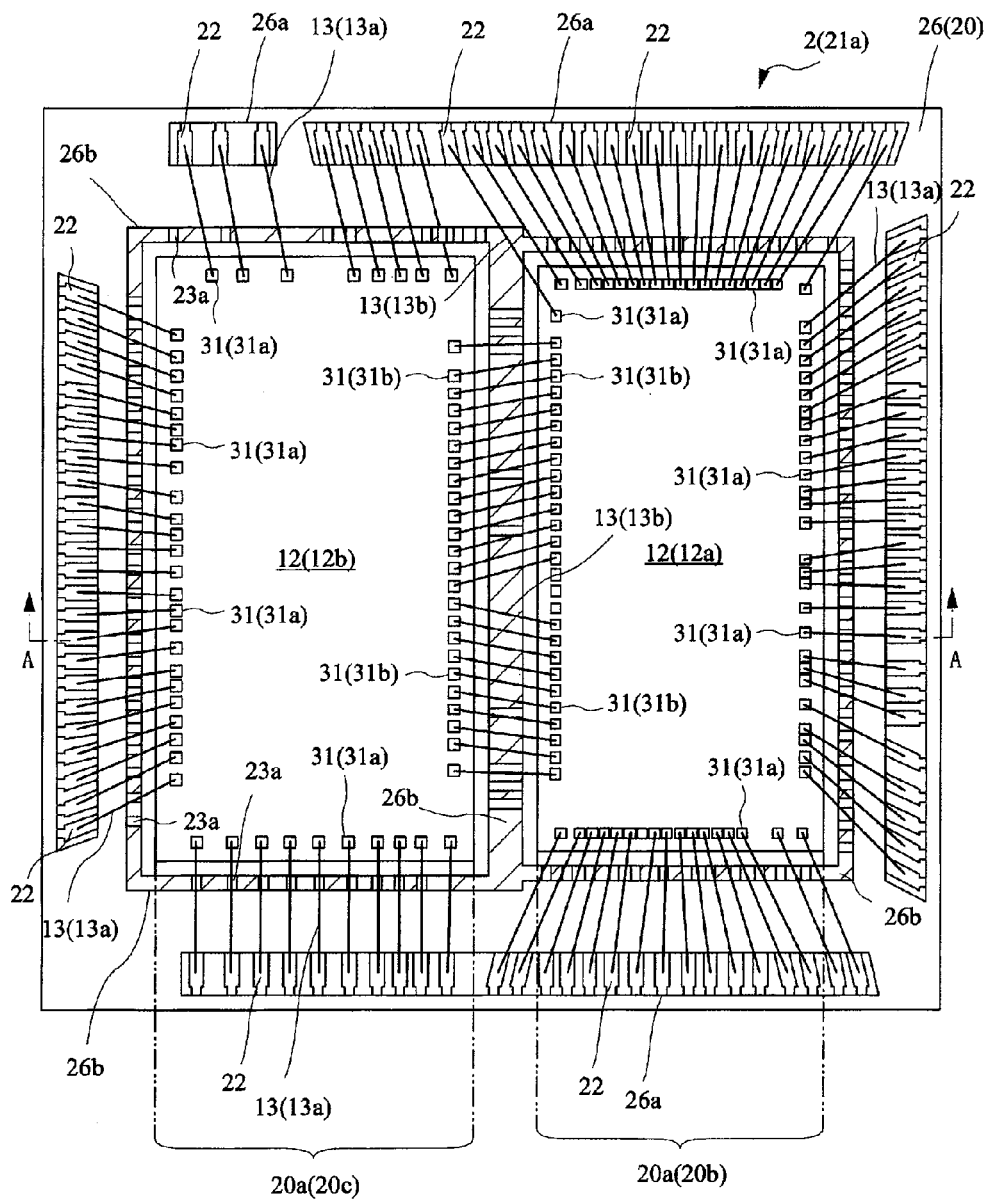
FIG. 2 is a planar view illustrating the internal structure on the upper surface side of the semiconductor device according to an embodiment of the present invention.
Figure 3:
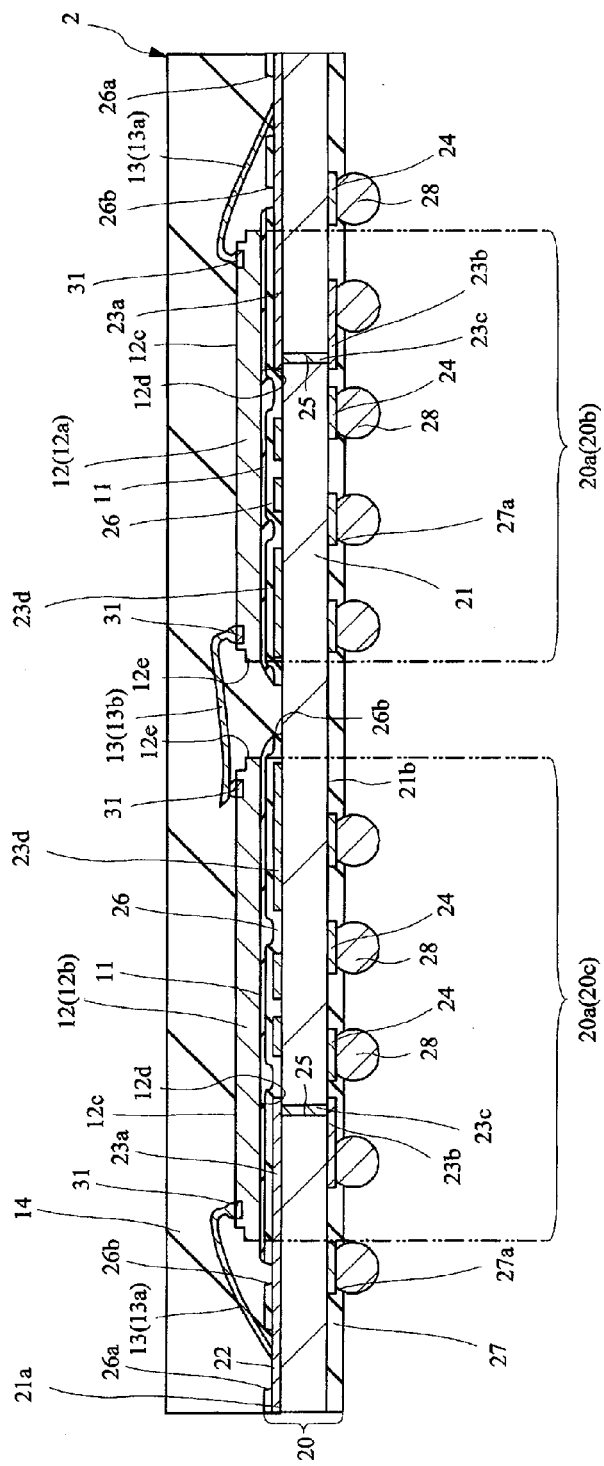
FIG. 3 is a cross sectional view taken along line A-A of FIG. 2.
Figure 4:
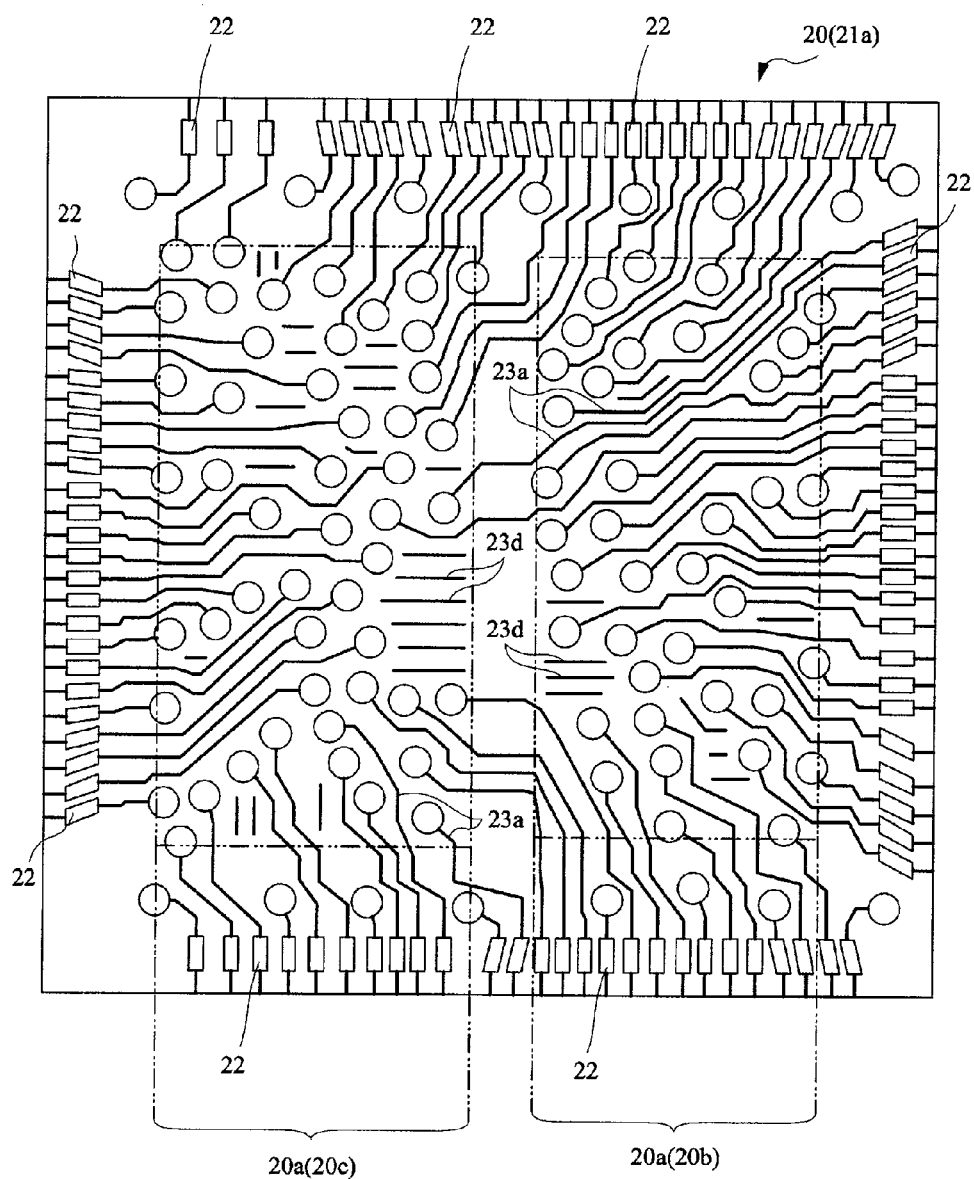
FIG. 4 is a planar view illustrating an exemplary wiring pattern formed on the upper surface side of the core layer, with the semiconductor chip and the insulating film (solder resist film) on the upper surface side shown in FIG. 1 removed.

Next, a configuration of the semiconductor device 2 shown in FIG. 1 will be described referring to FIGS. 1 to 4. The present embodiment is applied to a BGA (Ball Grid Array) type semiconductor device. FIG. 2 is a planar view illustrating the internal structure of the upper surface side of the BGA. FIG. 3 is a cross sectional view taken along line A-A of FIG. 2. In addition, FIG. 4 is a planar view illustrating an exemplary wiring pattern formed on the upper surface side of the core layer, with the semiconductor chip and the insulating film (solder resist film) on the upper surface side shown in FIG. 1 removed.

The semiconductor device 2 according to the present embodiment includes a wiring substrate 20 having an upper surface 21a, a plurality (two in the present embodiment) of semiconductor chips 12 (an AFE chip 12a and a VDR chip 12b) respectively mounted over the upper surface 21a of the wiring substrate (base material) 20 via an adhesive material (die bonding material) 11, a plurality of wires 13 (conductive members) which respectively couples the semiconductor chips 12 and the wiring substrate 20, and a sealing body (sealing resin) 14 which seals the semiconductor chips 12 and the wires 13.

The VDR chip 12b of the semiconductor chips 12 has formed therein a vertical driver circuit VDR including the level shifter described referring to FIG. 1. On the other hand, the AFE chip 12a has other AFE circuits except the vertical driver circuit VDR formed therein, for example, circuits driven by the 3.3V-system power supply, such as the horizontal driver circuit HDR, the timing generator TG, the noise reduction circuit CDS, the amplification circuit PGA, and the A/D conversion circuit ADC. As thus described, the semiconductor device 2 according to the present embodiment incorporates two types of semiconductor chips and, by electrically coupling them, composes a system which controls the imaging device shown in FIG. 1. In other words, the semiconductor device 2 is a SIP (System in Package) type semiconductor device which constructs a system by mounting several types of semiconductor chips in a single semiconductor device in a mixed manner.

Next, the wiring substrate 20, which is base material of the semiconductor device 2, will be described. The wiring substrate 20 has a core layer (insulating layer, core insulating layer) 21 having an upper surface 21a (chip-mounting side, surface) and a lower surface (installation side, rear surface) 21b located opposite to the upper surface 21a. The core layer 21 is made of a resin substrate having glass epoxy resin, for example, as an insulating layer.

As shown in FIG. 4, the upper surface 21a of core layer 21 has formed therein a plurality of terminals (bonding leads, electrode pads) 22, a plurality of wirings (upper surface-side wirings) 23a electrically coupled to the terminals 22 respectively, and a plurality of dummy wirings (wirings, upper surface-side wirings) 23d which are not electrically coupled to the terminal 22. In addition, although not illustrated, a plating layer is formed on the surface of the terminals 22. In the present embodiment, a gold (Au) film is laminated over a nickel (Ni) film, for example. In addition, as shown in FIG. 3, the lower surface 21b of the core layer 21 has formed therein a plurality of lands (terminals, electrode pads) 24, and a plurality of wirings (lower surface-side wirings) 23b electrically coupled to the terminals 22, respectively. In addition, although not illustrated, a plating layer is formed on the surface of the lands 24, which is a nickel (Ni) film in the present embodiment, for example. Over the core layer 21, as shown in FIG. 3, a via (hole) 25 is formed from one of the upper surface 21a and the lower surface 21b to the other side, and the wirings 23a and the wirings 23b are electrically coupled respectively through a wiring (intra-via wiring, intra-via conductor) 23c which is a conductor formed on the via 25. The terminals 22, the wirings 23a, 23b and 23c, the dummy wirings 23d, and the lands 24 are made of copper (Cu), respectively. In addition, the wirings 23a have linear parts extending from the terminals 22 toward the chip-mounting regions 20a, and circular parts formed integrally with the linear parts, as shown in FIG. 4. The circular parts formed on the vias 25 shown in FIG. 3 are joints (wiring parts on the vias) electrically coupling the wirings 23c. In the present embodiment, the wirings 23a include both the linear and the circular parts unless otherwise described with particular distinction.

In addition, as shown in FIGS. 2 and 3, an insulating film (upper surface-side insulating film, solder resist film) 26 made of insulating resin is formed on the upper surface 21a of the core layer 21, and the wirings 23a and the dummy wirings 23d (see FIG. 3) are covered by the insulating film 26. The insulating film 26 has a plurality of apertures 26a formed at positions respectively overlapping with the terminals 22, and the terminals 22 are exposed from the insulating film 26 at the apertures 26a. In addition, as shown in FIG. 3, an insulating film (lower surface-side insulating film, solder resist film) made of insulating resin 27 is formed similarly to the insulating film 26 in the lower surface 21b of the core layer 21, and the wirings 23b are covered by the insulating film 27. The insulating film 27 has a plurality of apertures 27a formed at positions respectively overlapping with the lands 24, and the lands 24 are exposed from the insulating film 27 at the apertures 27a. In addition, a plurality of solder materials (solder balls) 28, which work as external electrode terminals when installing the semiconductor device 2 in an installation substrate (not shown), are respectively joined at exposed portions of the lands 24.

FIG. 3 illustrates, as an example of the wiring substrate 20, a wiring substrate with two levels of wiring layers having a wiring pattern formed on the upper surface 21a and the lower surface 21b of the core layer 21. However, the number of wiring layers of the wiring substrate 20 is not limited to two, and a multi-layer wiring substrate having a plurality of wiring layers (wiring patterns) formed on the core layer 21 may be used, for example. It may be effectively applied to a semiconductor device having a large number of terminals because the wiring space can be further increased.

The planar shape of the upper surface 21a and the lower surface 21b of the core layer 21 (i.e., top and lower surfaces of the wiring substrate 20) is quadrangular, for example, a 5 mm-square in the present embodiment.

In addition, the wiring substrate 20 has a plurality of chip-mounting regions 20a in the upper surface 21a of the core layer 21. This embodiment has a chip-mounting region 20c mounting an AFE chip 12a and a chip-mounting region 20b mounting a VDR chip 12b. The chip-mounting regions 20a are arranged side by side. In other words, the semiconductor device 2 is a flatbed semiconductor device having a plurality of semiconductor chips arranged side by side. Each of the chip-mounting regions 20a has a quadrangular planar shape, which is a rectangle in the present embodiment. The chip-mounting regions 20b and 20c are arranged side by side, with their long sides facing each other. In other words, the first long side of the chip-mounting region 20b and the second long side of the chip-mounting region 20c are arranged so as to face each other.

In addition, as shown in FIG. 4, the wirings 23a and the dummy wirings 23d formed on the upper surface 21a of the core layer 21 are respectively formed on the lower layer of the chip-mounting regions 20b and 20c (overlapping position in a planar view). In other words, the chip-mounting regions 20b and 20c are provided on the wirings 23a and the dummy wirings 23d. The upper surface 21a of the core layer 21 can be effectively utilized as a drawing space of the wirings 23a by drawing the wirings 23a to be arranged as far as the lower layer of the chip-mounting regions 20b and 20c. The reason for arranging the dummy wirings 23d in the lower layer of the chip-mounting regions 20b and 20c is to prevent or suppress occurrence of a void in the adhesive material (die bonding material) 11, which will be described in detail when describing the method of manufacturing the semiconductor device 2 below. In addition, the planar view layout (arrangement pattern) of the wirings 23a and the dummy wirings 23d formed on the upper surface 21a of the core layer 21 will also be described in detail when describing the method of manufacturing the semiconductor device 2.

In addition, groove (dent, dam) 26b is formed in the circumference of each of the chip-mounting regions 20a. The groove 26b is formed by removing a part of the insulating film 26, in a manner surrounding each of the chip-mounting regions 20a. In the present embodiment, the insulating film 26 is removed in the region forming the groove 26b and a part of the wirings 23a is exposed in the groove 26b.

Next, the semiconductor chips 12 to be mounted over the wiring substrate 20 will be described. Each of the two semiconductor chips 12 (VDR chip 12b and AFE chip 12a) according to the present embodiment has a surface (main surface, upper surface) 12c, a rear surface (main surface, lower surface) 12d located opposite to the surface 12c, and a side surface 12e located between the surface 12c and the rear surface 12d.

The planar shape of the semiconductor chips 12 (shape of the surface 12c and the rear surface 12d) is generally quadrangular, and rectangular in this embodiment. Specifically, for example, the AFE chip 12a is 1.58 mm×3.25 mm, VDR chip 12b is 1.58 mm×3.58 mm. In the present embodiment, two semiconductor chips are planarly arranged side by side. Specifically, the semiconductor chips 12 are arranged side by side so that the long side of one of the semiconductor chips 12 faces (aligns with) the long side of the other one of the semiconductor chips 12, as shown in FIG. 2. By planarly arranging the semiconductor chips 12, each of which being rectangular, so that each long side faces each other, increase of the overall footprint of the semiconductor device (semiconductor package) can be suppressed, which leads to downsizing. Although the planar shape of the wiring substrate 20 is assumed to be a square in the present embodiment as described above, the planar shape of the wiring substrate 20 may be rectangular. When the wiring substrate 20 is a rectangle, increase of the overall footprint of the semiconductor device can be suppressed by setting the ratio between the long side and the short side of the planar shape (length of short side/length of long side) of the wiring substrate 20 to be larger than the ratio between the long side and the short side (length of short side/length of long side) of the semiconductor chips 12, which leads to downsizing. In addition, the thickness of the two semiconductor chips 12 according to the present embodiment is rendered thin, from the viewpoint of making the semiconductor device thinner, each with a thickness of 0.15 mm.

A plurality of pads (electrode pads) 31 is respectively formed over the surface 12c of the semiconductor chips 12. The pads 31 are arranged side by side along each side of the semiconductor chips 12 and on the peripheral part side of the surface 12c. In addition, a plurality of semiconductor elements (circuit elements) such as diodes and transistors is respectively formed on the surface 12c side of the semiconductor chips 12, and electrically coupled to the pads 31 respectively via an unillustrated wiring (wiring layer) formed over the semiconductor element. As thus described, the semiconductor chips respectively compose a circuit such as the above-mentioned driver circuit by the semiconductor elements formed on the surface 12c side and a wiring that electrically couples them.

The base material (semiconductor substrate) of the semiconductor chips 12 is made of silicon (Si), for example. In addition, an insulating film is formed over the surface 12c, with each surface of the pads 31 being exposed from the insulating film in an aperture formed on the insulating film.

In addition, the pads 31 are made of metal, for example, aluminum (Al), in the present embodiment. Furthermore, a plating film is formed on the surface of the pads 31, which is a multilayer structure having a gold (Au) formed therein via a nickel (Ni) film, for example, in the present embodiment.

In addition, the semiconductor chips 12 are electrically coupled to the wiring substrate 20 respectively via the wires 13 (chip to wiring substrate coupling). Specifically, one end of the wire 13a is coupled to a pad 31a of each of the semiconductor chips 12, whereas the other end is coupled to the terminal 22 of the wiring substrate 20. In the present embodiment, the semiconductor chips 12 are directly and electrically coupled via a wire 13b. Specifically, one end of the wire 13b is coupled to a pad 31b of one of the semiconductor chips 12 (e.g., the chip AFE 12a in the present embodiment), whereas the other end of the wire 13b is coupled to the pad 31b of the other one of the semiconductor chips 12 (e.g., the VDR chip 12b in the present embodiment). In addition, the pad 31b coupled to the wire 13b that provides coupling between the semiconductor chips 12 (chip-to-chip coupling) is arranged along the sides, among the four sides of the quadrangular semiconductor chips 12, facing and adjacent to each other (the long sides in the present embodiment). In this manner, the length of the wire 13b (i.e., transmission distance) can be shortened.

Additionally, in the present embodiment, the terminals 22 are not formed between the AFE chip 12a and the VDR chip 12b, and the terminals 22 are arranged in a manner surrounding the semiconductor chips 12. Accordingly, since the distance between the semiconductor chips arranged side by side can be shortened, increase of the overall footprint of the semiconductor device can be suppressed, which leads to downsizing. But, for example, the arrangement layout of the terminals 22 is not limited to the aspect shown in FIG. 2, and can be arranged between the AFE chip 12a and the VDR chip 12b.

As shown in FIG. 2, the two semiconductor chips 12 each have a different number of pads 31 which function as external terminals. Specifically, the number of pads 31 of the AFE chip 12a is larger than that of pads 31 of the VDR chip 12b. This is because the AFE chip 12a and the VDR chip 12b are different types of semiconductor chips 12 having different circuits formed therein, and hence the number of required external terminals is different. Therefore, some of the pads 31 arranged at the side facing the long side of the VDR chip 12b, among the four sides of the AFE chip 12a, are electrically coupled to the terminals 22 via the wires 13.

The semiconductor chips 12 are adhesively fixed to the chip-mounting regions 20a of the wiring substrate 20 via an adhesive material 11 with the rear surface 12d of the semiconductor chips 12 facing the upper surface 21a of the core layer 21 of the wiring substrate 20. The adhesive material 11, made of epoxy thermosetting resin, for example, covers the entire rear surface 12d of the semiconductor chips 12 and further extends to the edge of the groove 26b located outside thereof.

In addition, a sealing body 14 is formed on the upper surface 21a side of the wiring substrate 20, and the semiconductor chips 12 and the wires 13 are sealed (resin sealed) with the sealing body 14.

<Manufacturing Step of Semiconductor Device>

Figure 5:
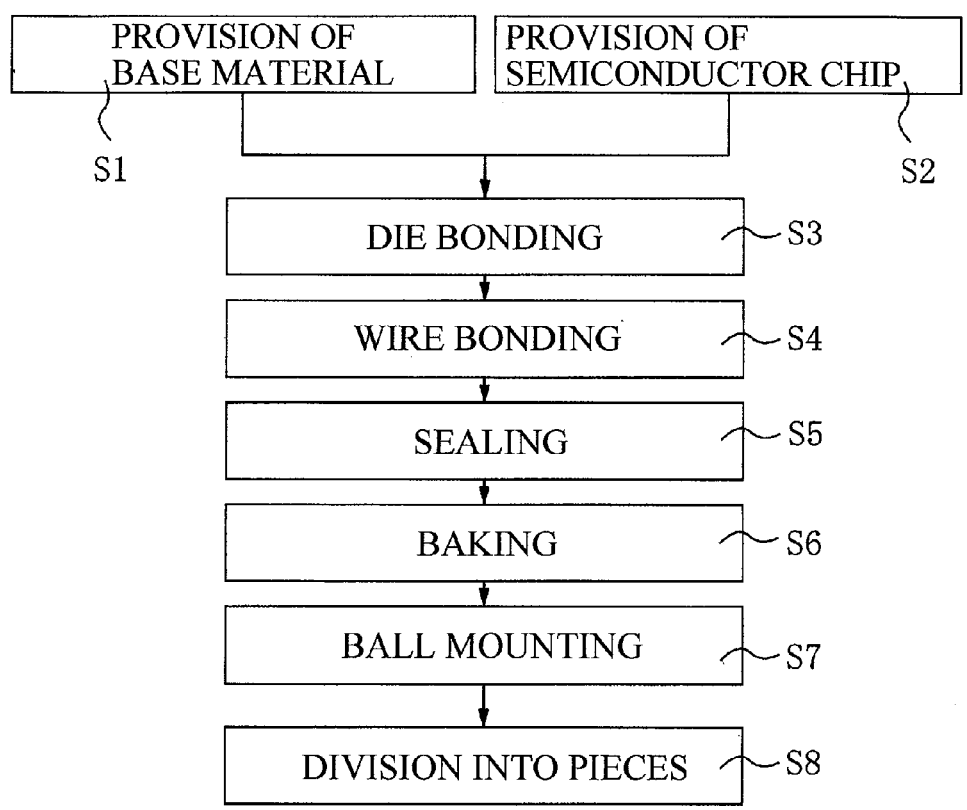
FIG. 5 is an explanatory view illustrating an assembling flow of the semiconductor device shown in FIGS. 1 to 3.

Next, a manufacturing step of the semiconductor device 2 according to the present embodiment will be described. The semiconductor device 2 according to the present embodiment is manufactured along the assembly flow shown in FIG. 5. FIG. 5 is an explanatory view illustrating an assembling flow of the semiconductor device shown in FIGS. 1 to 3. Details of each step will be described below, referring to FIGS. 6 to 24.

Figure 6:
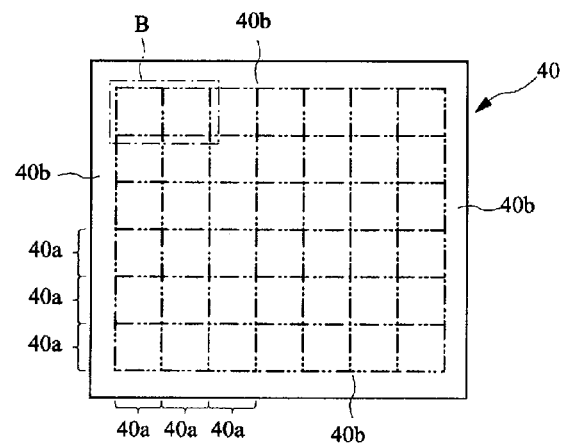
FIG. 6 is a planar view illustrating the overall structure of a wiring substrate provided in the base material provision step shown in FIG. 5.
Figure 7:
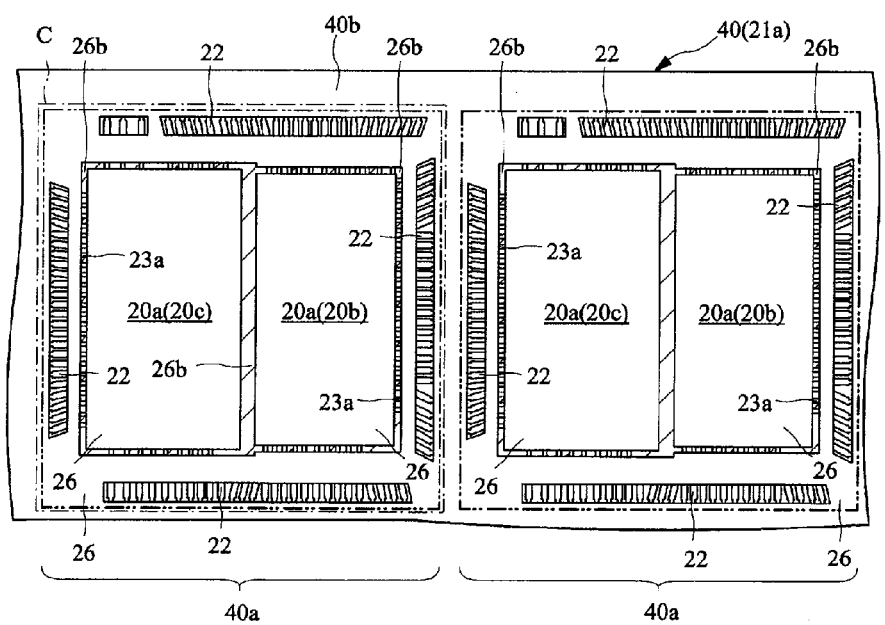
FIG. 7 is an enlarged planar view enlarging the part B of FIG. 6.

1. Base Material (Wiring Substrate) Provision Step;

First, in the base material provision step S1 shown in FIG. 5, a wiring substrate 40 as shown in FIG. 6 is provided. FIG. 6 is a planar view illustrating the overall structure of a wiring substrate provided in the base material provision step shown in FIG. 5, and FIG. 7 is an enlarged planar view enlarging the part B of FIG. 6. In addition, FIG. 8 is an enlarged planar view illustrating, for a device region shown in FIG. 7, the exemplary wiring pattern formed on the upper surface side of the core layer with the insulating film (solder resist film) on the upper surface side removed.

The wiring substrate 40 used in the present embodiment has a plurality of device regions 40a inside a frame body (frame part) 40b as shown in FIG. 6. The wiring substrate 40 having the device regions 40a is a so-called multi-piece substrate.

Each of the device regions 40a has the chip-mounting regions 20a including the chip-mounting region 20b having mounted therein the AFE chip 12a (see FIG. 2) and the chip-mounting region 20c having mounted therein the VDR chip 12b (see FIG. 2), and the terminals (bonding leads) 22 arranged side by side around the chip-mounting regions 20a, as shown in FIG. 7. Accordingly, the chip-mounting regions 20a are surrounded by the terminals 22 in planar view. The planar shapes of the chip-mounting regions 20b and 20c are respectively quadrangular corresponding to the planar shape of the mounted semiconductor chips 12 (see FIG. 2), and rectangular in the present embodiment. In addition, the chip-mounting regions 20b and 20c are arranged so that the long sides, among the four sides thereof, face each other. In other words, the chip-mounting regions are arranged so that the first long side of the chip-mounting region 20b and the second long side of the chip-mounting region 20c face each other. In addition, no terminal 22 is formed between the chip-mounting regions 20b and 20c in planar view. Therefore, the footprint of the device regions 40a, i.e., the footprint of the semiconductor device 2 shown in FIG. 2 can be downsized, because the chip-mounting regions 20b and 20c can be arranged close to each other.

Figure 8:
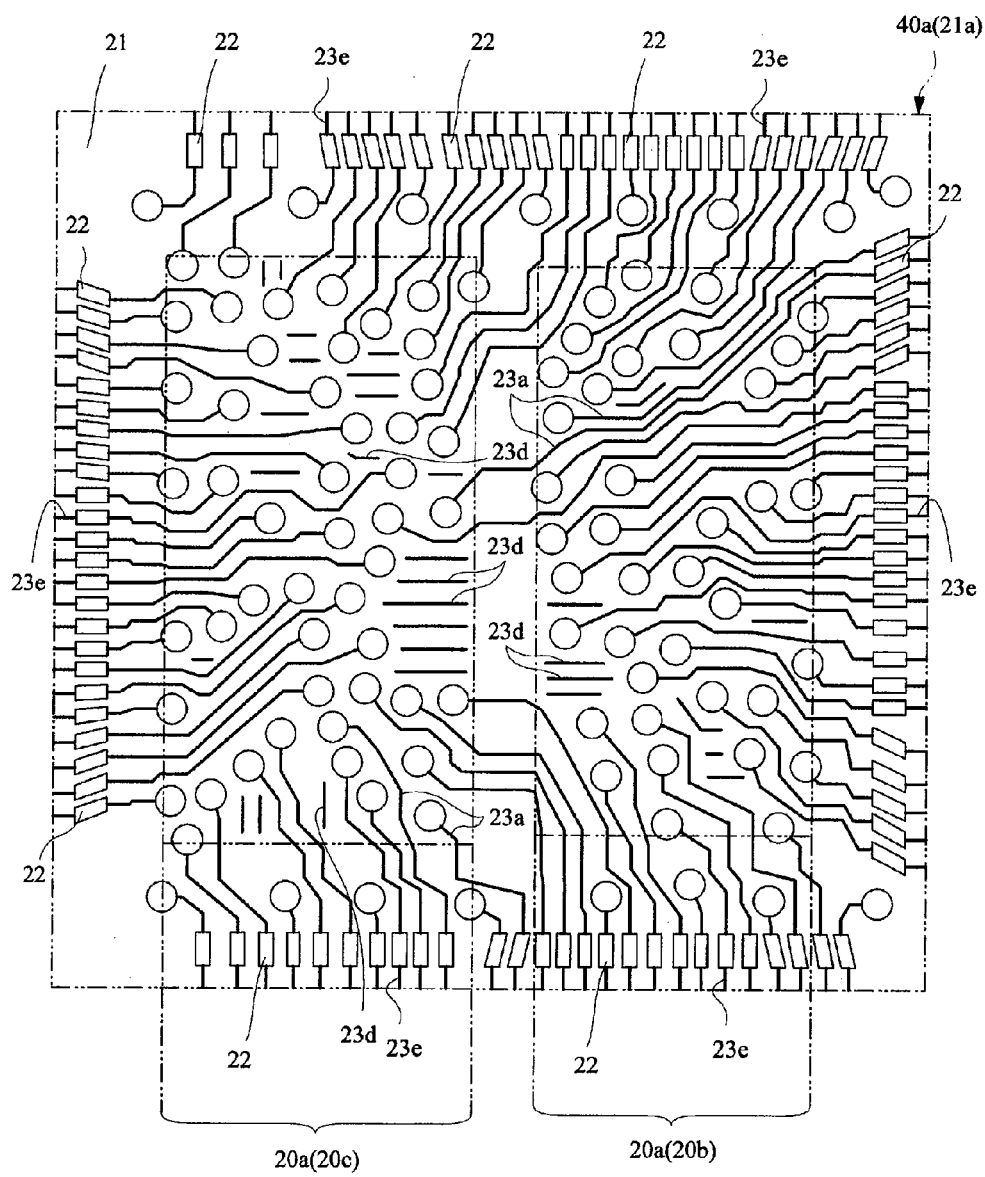
FIG. 8 is an enlarged planar view illustrating, for a device region shown in FIG. 7, the exemplary wiring pattern formed on the upper surface side of the core layer with the insulating film (solder resist film) on the upper surface side removed.

In addition, as shown in FIG. 8, the terminals 22 are electrically coupled to the wirings 23a respectively. Specifically, the wirings 23a are coupled to the inner ends (side of the chip-mounting regions 20a) of the terminals 22 respectively, and the wirings 23a are extended from the terminals 22 toward the chip-mounting regions 20a. In addition, a plurality of power supply lines 23e are coupled to the outside of the terminals 22 (at the outer edge of the device regions 40a), and the power supply lines 23e are extended from the terminals 22 outward of the device regions 40a. The power supply lines 23e supply electric power when forming the wirings 23a, the dummy wirings 23d, and the terminals 22 in the upper surface of the core layer 21 by electrolytic plating method. In the present embodiment, the wirings 23a, the dummy wirings 23d, and the terminals 22 compose a plating layer formed by electrolytic plating using the power supply lines. By drawing the wirings 23a to the inside of the chip-mounting regions 20a and effectively using the space of the upper surface 21a of the core layer 21, the wirings 23a can be effectively drawn while preventing or suppressing increase of the overall footprint, even if the number of the terminals increases. Although the dummy wirings 23d shown in FIG. 8 are not coupled to the power supply lines 23e, they may be formed by the following method, for example. That is, a plating layer is formed by electrolytic plating in the entire upper surface 21a of the core layer 21 according to the patterns of the wirings 23a, the dummy wirings 23d, and the terminals 22 shown in FIG. 1, with a base conductive layer (e.g., a copper film: not shown) and a plating mask over the base conductive layer (not shown) being laminated therein, and subsequently removing the base conductive layer. The arrangement layout and shape of the dummy wirings 23d will be described in detail in the die bonding step described below.

In addition, as shown in FIG. 7, the upper surface 21a of the core layer 21 is covered by the insulating film 26. The insulating film 26 has formed thereon an aperture from which the terminals 22 are exposed. In addition, the groove 26b that functions as a dam is formed in a manner surrounding the chip-mounting regions 20b and 20c between the terminals and the chip-mounting regions 20a and between chip-mounting regions 20b and 20c, as shown in FIG. 7, to prevent adhesive material paste which is supplied to the chip-mounting regions 20a in the subsequent die bonding step from overly liquefying and spreading from the supplied site toward the circumference. In the present embodiment, the groove 26b is not formed independently for the chip-mounting regions 20b and 20c respectively, but a single groove 26b is formed between the chip-mounting regions 20a. In other words, the groove 26b is integrally formed and the chip-mounting regions 20b and 20c share the groove 26b that functions as a dam. Since the interval between the chip-mounting regions 20b and 20c can be narrowed by forming a single groove 26b between the chip-mounting regions 20b and 20c, the footprint of the device regions 40a, i.e., the footprint of the semiconductor device 2 shown in FIG. 2 can be downsized. In the groove 26b, a part of the wirings 23a is exposed from the insulating film 26.

2. Semiconductor Chip Provision Step;

In the semiconductor chip provision step S2 shown in FIG. 5 the semiconductor chips 12 shown in FIG. 2 are provided. In this step, a semiconductor wafer (not shown) made of silicon, for example, having a plurality of chip regions is provided. Subsequently, a dicing blade is run (not shown) along a dicing line of the semiconductor wafer to divide the semiconductor wafer and acquire the semiconductor chips 12 shown in FIG. 2 (wafer dicing step). Specifically, there are provided a semiconductor wafer having circuits of the AFE chip 12a shown in FIG. 2 respectively formed on a plurality of chip regions, and a semiconductor wafer having circuits of the VDR chip 12b shown in FIG. 2 respectively formed on a plurality of chip regions. Each semiconductor wafer is then divided into pieces, whereby a plurality of the AFE chips 12a and the VDR chips 12b of are acquired. In the wafer dicing step in the present embodiment, for example, a semiconductor wafer is cut in several (e.g., two) steps using several types (e.g., two types) of dicing blades having different widths (step dicing method). First, a dicing blade having a first width cuts halfway through the semiconductor wafer (first step). Subsequently, the remaining part that is left in the first step is cut using a dicing blade having a second width which is narrower than the first width to divide the wafer into the semiconductor chips 12. Using such a step dicing method, chamfering is performed on the periphery of the surface 12c of the semiconductor chips 12 as shown in FIG. 3. In the present embodiment, the shape resulting from the chamfering is that of a staircase as shown in FIG. 3. In other words, a bump is formed on the periphery of the surface 12c of the semiconductor chip 12.

Figure 9:
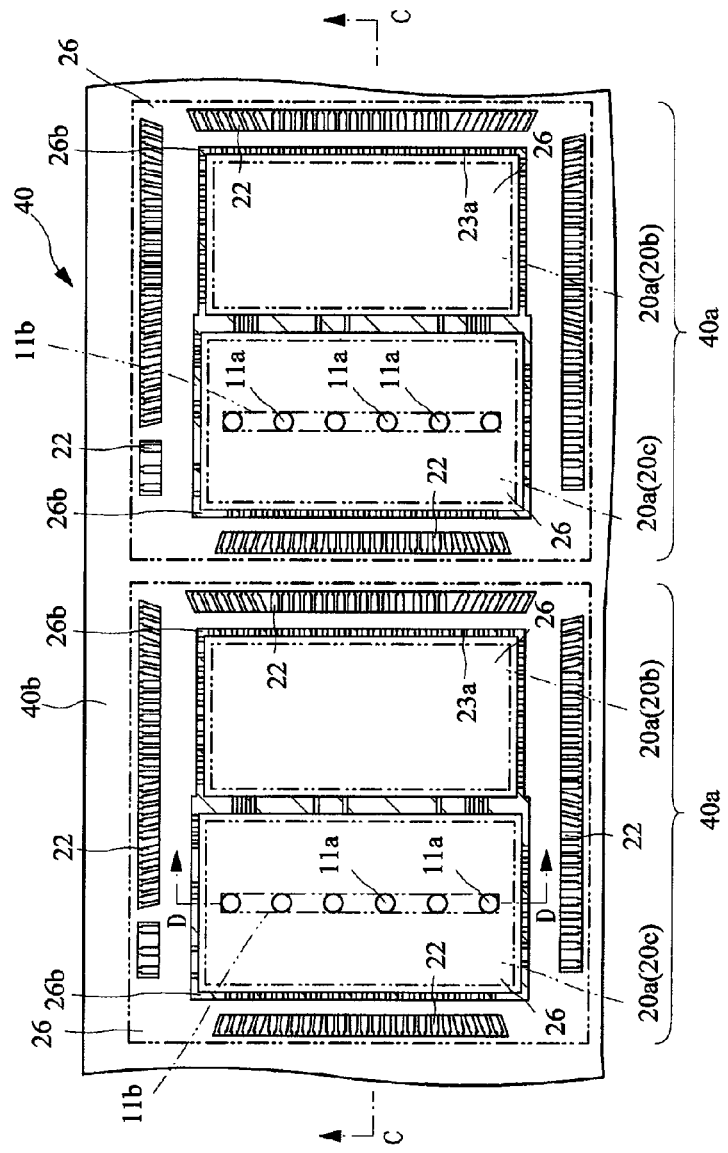
FIG. 9 is an enlarged planar view illustrating a first adhesive material application step in the die bonding step shown in FIG. 5.

3. Die Bonding Step;

Next, a die bonding step S3 shown in FIG. 5 will be described. FIG. 9 is an enlarged planar view illustrating a first adhesive material application step in the die bonding step shown in FIG. 5, FIG. 10 is an enlarged cross-sectional view taken along line C-C of FIG. 9, and FIG. 11 is an enlarged cross-sectional view taken along line D-D of FIG. 9.

Figure 10:
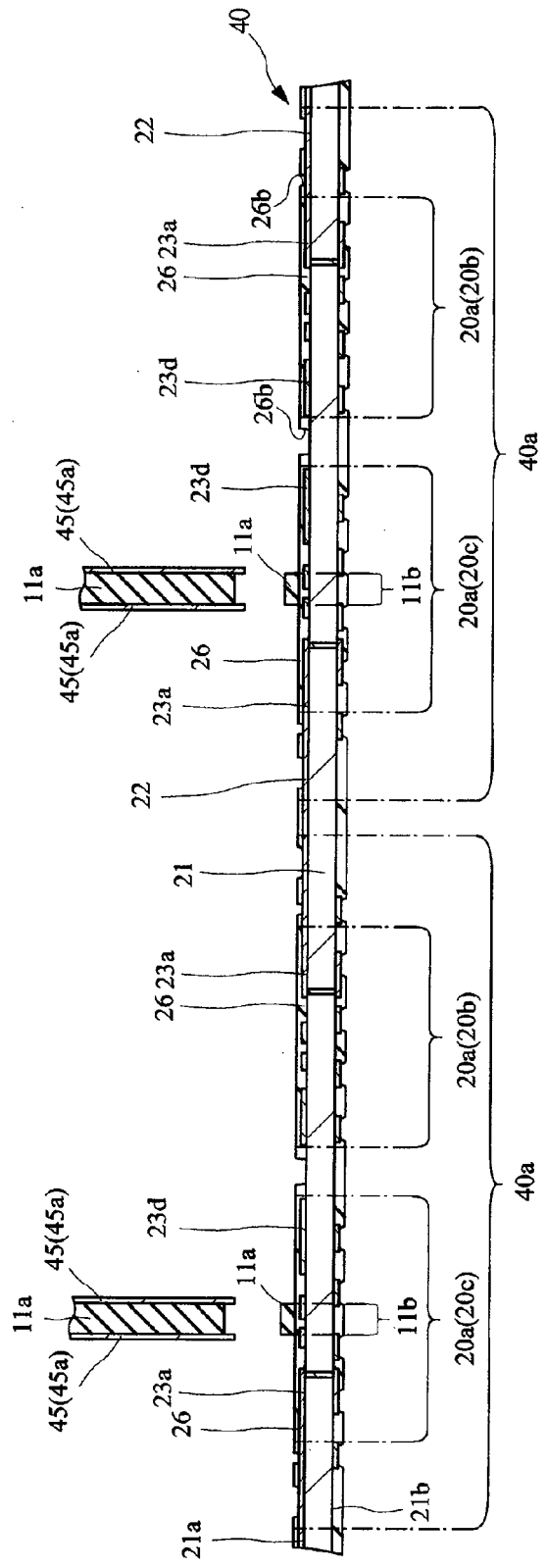
FIG. 10 is an enlarged cross-sectional view taken along line C-C of FIG. 9.

First, in the first adhesive material application step, adhesive material paste (paste-like die bonding material) 11a is applied as shown in FIGS. 9 and 10. The adhesive material paste 11a is a paste-like adhesive material including thermosetting resin, for example, and flowable before curing (thermosetting) thereof. Although the adhesive material used in the present embodiment is flowable, it has a certain level of viscosity (e.g., 20 to 150 Pa*s at 20 deg. Celsius), which is higher than the viscosity ($1*10^{-3}$ Pa*s at 20 deg Celsius) of water (H2O) generally referred to as a liquid state. In this step, the adhesive material paste 11a is applied to one of the chip-mounting regions 20b and 20c of respective device regions 40a. Although the order of applying the adhesive material paste 11a on the chip-mounting regions 20a is not limited, it is applied to the chip-mounting region 20c having mounted thereover the VDR chip 12b (see FIG. 2) in the present embodiment.

Figure 11:
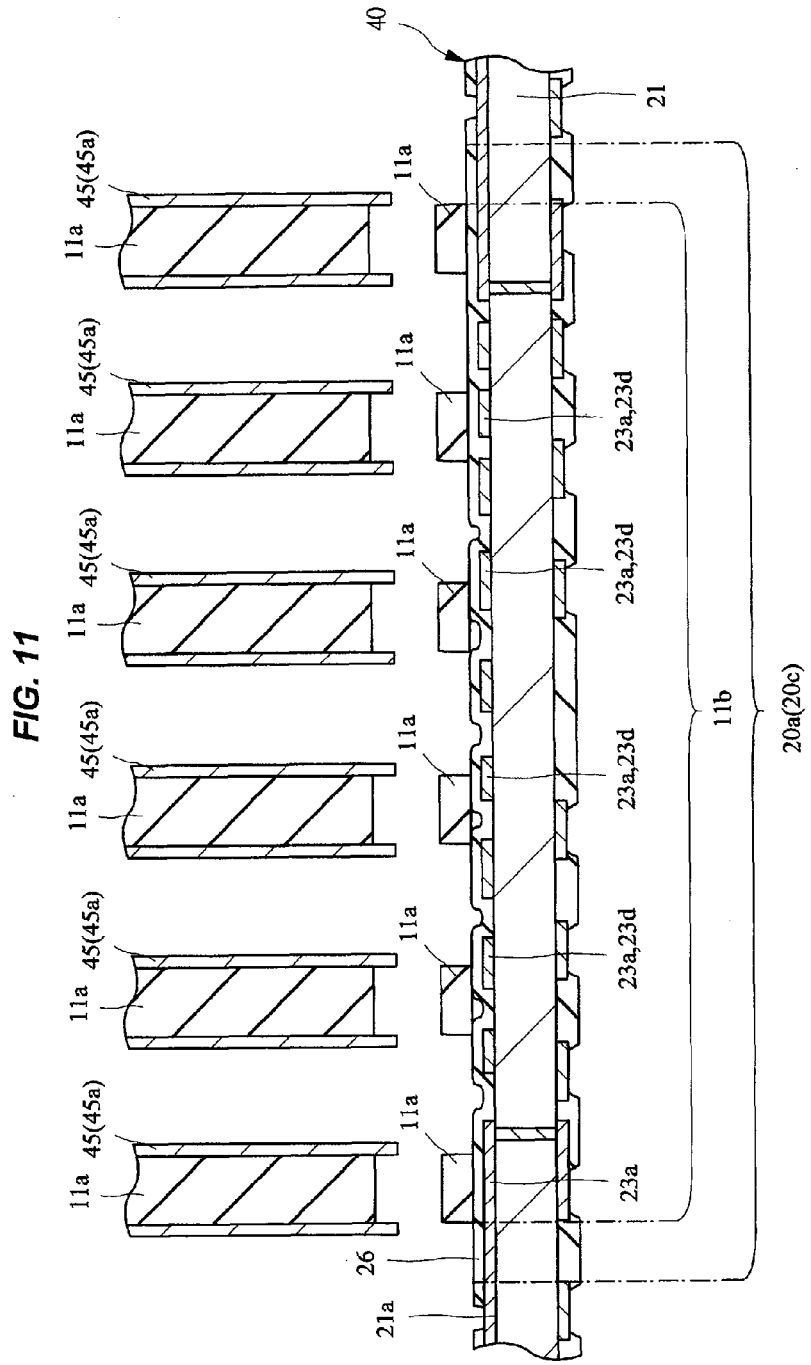
FIG. 11 is an enlarged cross-sectional view taken along line D-D of FIG. 9.

Specifically, as shown in FIGS. 10 and 11, the adhesive material paste 11a is applied to the insulating film 26 covering the upper surface 21a of the wiring substrate 40 via a nozzle 45. In the present embodiment, the adhesive material paste 11a is applied to a plurality of positions on the chip-mounting regions 20a (adhesive material application regions 11b) using the nozzle 45 having a plurality of branched outlets 45a. For example, the present embodiment as shown in FIG. 11 uses the nozzle 45 made of six branched outlets 45a having a circular shape of 0.2 mm φ. The outlets 45a have an arrangement pitch (center to center distance) of 0.55 mm, for example, and generally spaced apart with a regular interval along a centerline (virtual line) binding the centers of the two short sides facing each other, among the four sides of the chip-mounting region 20a shown in FIG. 9. In this occasion, the adhesive material paste 11a supplied to each of the multiple parts in the chip-mounting regions 20a (inside a region overlapping with the semiconductor chip to be mounted in a subsequent step) is arranged across the centerline (virtual line). As a modified example (see the modified example 1 described in detail below) of the method of applying the adhesive material paste 11a to a plurality of positions on the chip-mounting region 20a (multi-point application), for example, a method may be used which scans a nozzle with an unbranched outlet 45a and applies the adhesive material paste 11a in a band-shaped manner (band-shape application). However, the multi-point application method as shown in FIG. 9 is preferred in that adhesive material paste 11a can be applied in a shorter time. In other words, the multi-point application method shown in FIG. 9 is preferred from the viewpoint of improving the efficiency of manufacturing.

If an excessive amount of the adhesive material paste 11a is used when mounting the thin (e.g., 0.15 mm) semiconductor chip 12 (see FIG. 2) on the wiring substrate 40, as in the present embodiment, a part of the adhesive material paste 11a running over the circumference of the semiconductor chip 12 crawls up to the surface 12c (see FIG. 2) of the semiconductor chip 12. It is preferred to reduce the amount of applying (amount of coating) the adhesive material paste 11a to suppress such crawling up of the adhesive material paste 11a, and thus the total amount of applying the adhesive material paste 11a (total amount of application) to the chip-mounting region 20a is limited to about 0.1 mg, for example, in the present embodiment. In other words, when the outlet 45a of the nozzle 45 is branched into six-fold as shown in FIG. 11, the adhesive material paste 11a applied from each outlet 45a is about 0.017 mg. Additionally, in the subsequent step of mounting a semiconductor chip, the load generated when mounting the semiconductor chip on the wiring substrate causes the adhesive material paste 11a to spread around the circumference of the part where the adhesive material paste 11a is applied. In order to suppress crawling up of the adhesive material paste 11a, therefore, the adhesive material paste 11a is not applied in a manner covering nearly all over the chip-mounting region 20a in the present embodiment, but the adhesive material paste 11a is coated (applied) on a region (adhesive material application region 11b) which is separated inward from the periphery (extending part) of the semiconductor chip to be mounted, as shown in FIG. 9.

As shown in FIG. 3, it is preferred to spread the adhesive material paste 11a all over the chip-mounting region 20a in order to securely fix the semiconductor chips 12 to the wiring substrate 20. Therefore, the following application method is particularly effective when reducing the amount of application of the adhesive material paste 11a, in the present embodiment. Specifically, as shown in FIG. 9, the adhesive material paste 11a is applied along the centerline binding the centers of the short sides facing each other, among the four sides of the chip-mounting region 20a, and the adhesive material paste 11a is applied to the adhesive material application region 11b extending along the centerline (regardless of the multi-point application, or the band-shaped application). In other words, the method of applying the adhesive material paste 11a from one of the short side of the chip-mounting region 20a to the other short side facing thereof is effective in this step. The adhesive material application region 11b arranged in this manner has a band-shaped planar shape extending along the long side of the chip-mounting region 20a. Accordingly, in the step of spreading the adhesive material paste 11a in the chip-mounting region 20a around the adhesive material application region 11b, the adhesive material paste 11a is spread mainly toward the long side of the chip-mounting region 20a, whereby the travel distance (distance from the adhesive material application region 11b to the periphery of the chip-mounting region 20a) of the adhesive material paste 11a can be shortened. Therefore, generation of a region that is not covered by the adhesive material paste 11a (region which may cause a void) in the chip-mounting region 20a can be suppressed.

In addition to the adhesive material paste of the present embodiment, the adhesive material for adhesively fixing a semiconductor chip on a base material such as a wiring substrate may also be of a type such that an adhesive tape formed in the shape of a film is preliminarily adhered to the rear surface of the semiconductor chip. The adhesive tape formed in the shape of a film to be preliminarily adhered to the rear surface of the semiconductor chip is referred to as a DAF (Die Attach Film).

However, the present embodiment uses the flowable adhesive material paste 11a for the following reason. The insulating film 26 covering the upper surface 21a of the wiring substrate 40 is made of a resin material which is softer than the metal materials used for the wirings 23a formed over the upper surface 21a. Therefore, the surface (upper surface) of the insulating film 26 has a flatness lower than that of the core layer 21 and has an unevenness following the conductor pattern of the wirings 23a formed over the upper surface 21a (see FIG. 11, for example). Additionally, in the present embodiment, the wirings 23a are extended to the inside of the chip-mounting region 20a to secure a space for drawing the wiring path as described above. In other words, the surface (upper surface) of the insulating film 26 in the chip-mounting region 20a has unevenness following the wirings 23a. When adhesively fixing the semiconductor chip via an adhesive tape such as a DAF, with unevenness existing in the surface of the insulating film 26 in the chip-mounting region 20a, there may be a case that a gap is generated between the adhesive tape and the insulating film 26. If, on the other hand, the flowable adhesive material paste 11a is used as with the present embodiment, adhesiveness between the rear surface of the semiconductor chip and the insulating film 26 can be improved because the adhesive material paste 11a can be buried following the unevenness in the surface of the insulating film 26.

Figure 12:
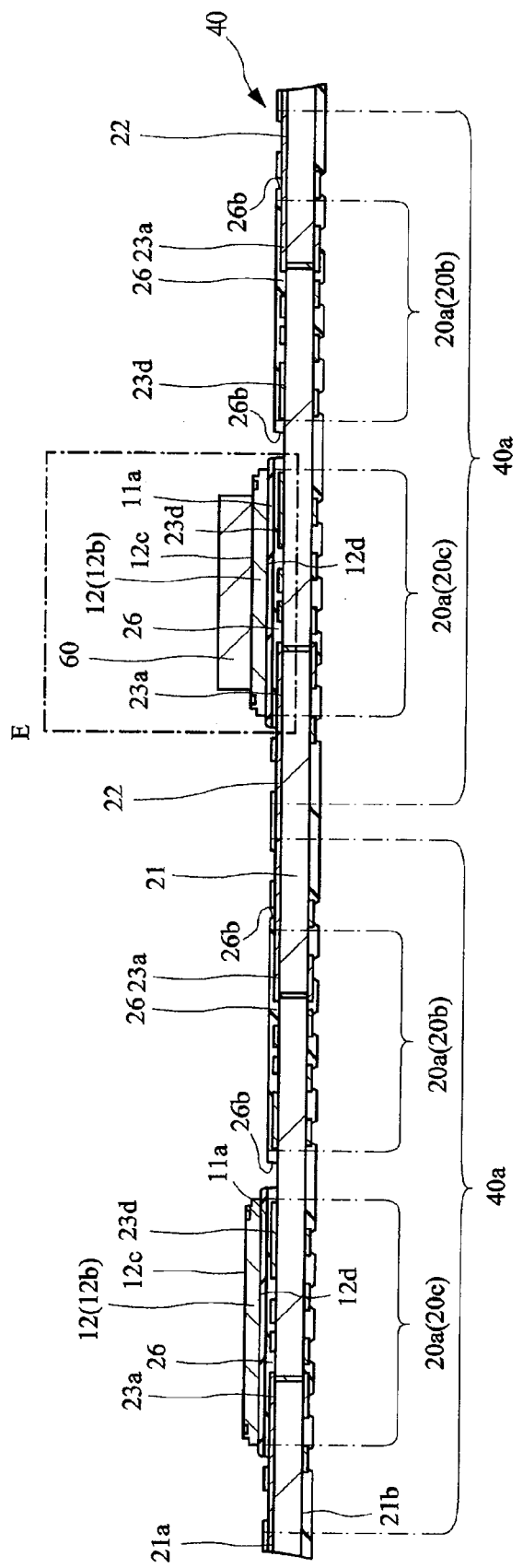
FIG. 12 is an enlarged cross-sectional view illustrating a step of mounting a semiconductor chip in a chip-mounting region of the wiring substrate shown in FIG. 10.

Next, in the first semiconductor chip-mounting step, the semiconductor chip 12 is mounted in the chip-mounting region 20a of the wiring substrate 40 as shown in FIG. 12. In the present embodiment, the VDR chip 12b is mounted over the chip-mounting region 20c having the adhesive material paste 11a applied thereon in the above-mentioned first adhesive material application step. The semiconductor chip 12 is mounted in the chip-mounting region 20a so that the rear surface 12d, of the semiconductor chip 12 faces the upper surface 21a of the chip-mounting region 20a (face-up installation). FIG. 12 is an enlarged cross-sectional view illustrating a step of mounting a semiconductor chip in a chip-mounting region of the wiring substrate shown in FIG. 10, FIG. 13 is an explanatory view schematically illustrating how the adhesive material paste spreads in the part E shown in FIG. 12, and FIG. 14 is an explanatory view schematically illustrating a planar spreading direction of the adhesive material paste in the chip-mounting region shown in FIG. 9.

In this step, the semiconductor chip 12 provided in the semiconductor chip provision step is first transported to the chip-mounting region 20a using a retention jig 60 shown in FIG. 12. Subsequently, the rear surface 12d of the semiconductor chip 12 is brought toward the upper surface 21a of the wiring substrate 40 to be mounted therein. Specifically, the semiconductor chip 12 is pressed from the main surface 12c side using the retention jig 60 shown in FIGS. 12 and 13, for example, thereby pressing the semiconductor chip 12 against the upper surface 21a of the wiring substrate 40 (applying a load (die bonding load)). In this case, the retention jig 60 functions as a pressing jig. In this occasion, since the adhesive material paste 11a is flowable as described above, pressing the semiconductor chip 12 against the wiring substrate 40 (applying a load (die bonding load) to the adhesive material paste 11a), causes the adhesive material paste 11a to spread (liquefy and spread) on a plane around the adhesive material application region 11b (see FIGS. 13 and 14) on the chip-mounting region 20a. In other words, pressing the semiconductor chip 12 against the wiring substrate 40 causes the adhesive material paste 11a to spread from a region overlapping with the semiconductor chip 12 mounted in this step as shown in FIG. 14 (region separated inward from the periphery of the semiconductor chip 12) to the outside of the semiconductor chip 12.

Figure 13:
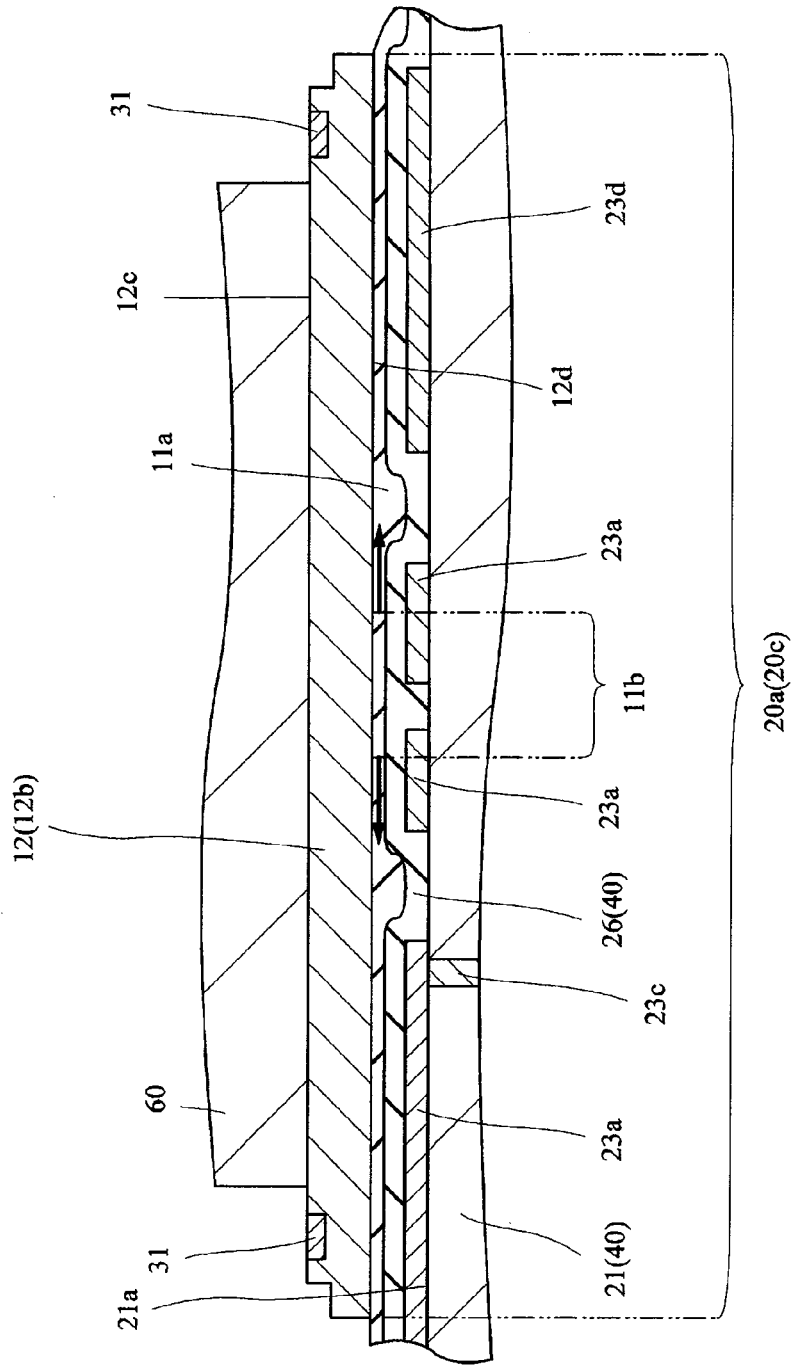
FIG. 13 is an explanatory view schematically illustrating how the adhesive material paste spreads in the part E shown in FIG. 12.
Figure 14:
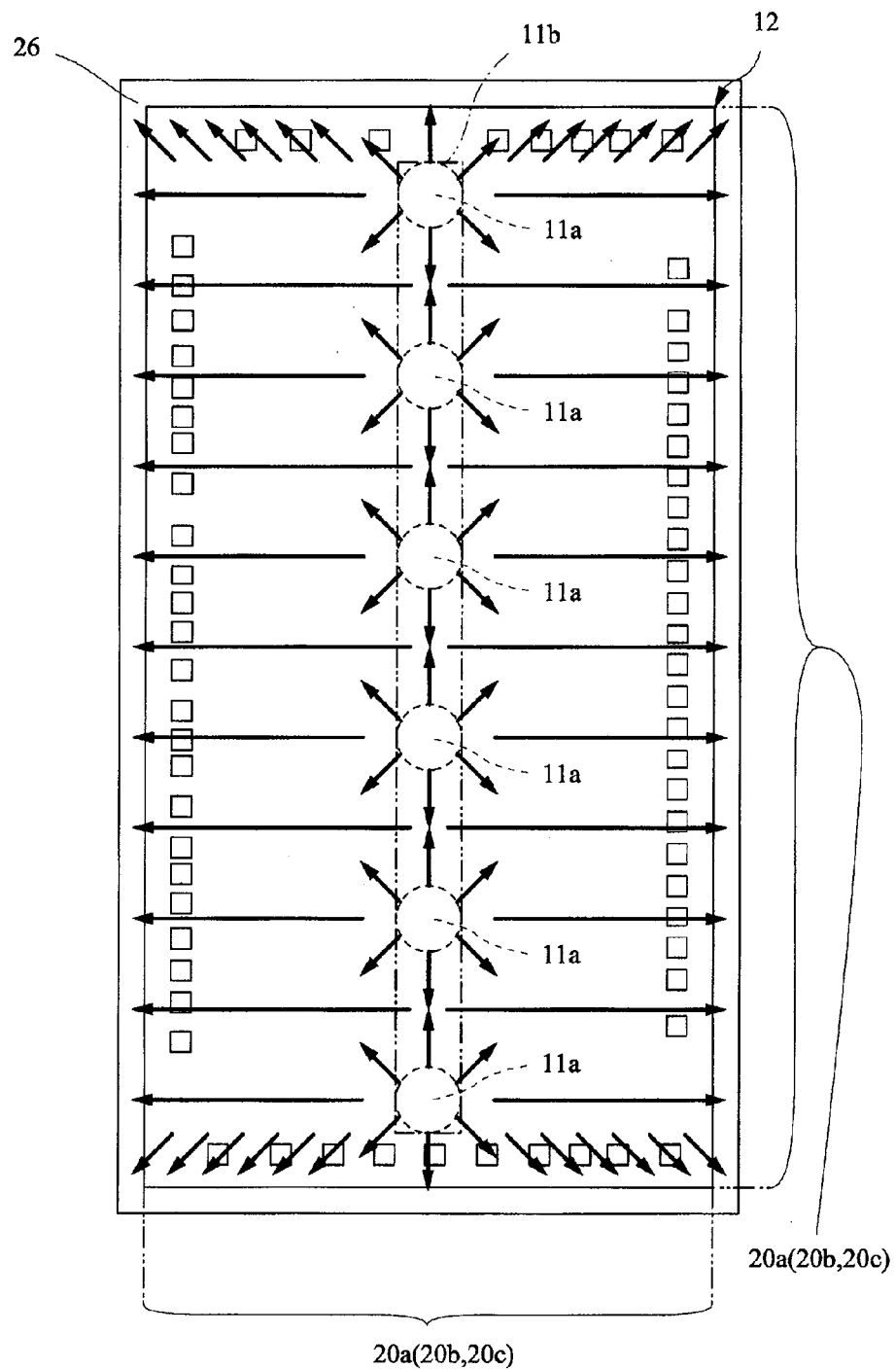
FIG. 14 is an explanatory view schematically illustrating a planar spreading direction of the adhesive material paste in the chip-mounting region shown in FIG. 9.

More specifically, the adhesive material paste 11a spread around the adhesive material application region 11b while being buried in the gap of the unevenness formed on the surface of the insulating film 26 of the chip-mounting region 20a, as shown by an arrow in FIGS. 13 and 14, and spreads outside the outer edge of the rear surface 12d of the semiconductor chip 12. Additionally, as shown in FIG. 14, the adhesive material paste 11a spreads from the adhesive material application region 11b provided on the centerline connecting the centers of the short sides of the chip-mounting region 20a mainly toward the two long sides of the chip-mounting region 20a. At the vicinity of each of the two short sides of the chip-mounting region 20a, a part of the adhesive material paste 11a spreads toward the short side of the chip-mounting region 20a from the adhesive material application region 11b. When applying the adhesive material paste 11a according to the multi-point application method as in the present embodiment, a part of the adhesive material paste 11a spreads in the adhesive material application region 11b toward the adjacently applied adhesive material paste 11a, as shown in FIG. 14. However, after the adjacently applied adhesive material paste 11a is mixed and blended, it spreads toward the two long sides of the chip-mounting region 20a as shown in FIG. 14.

Since the adhesive material paste 11a can cover almost all over the rear surface 12d (e.g., more than 90% of the rear surface 12d) of the semiconductor chip 12 by causing the adhesive material paste 11a to liquefy and spread outside the outer edge of the rear surface 12d of the semiconductor chip 12, the semiconductor chip 12 can be securely fixed to the wiring substrate 40 (the insulating film 26 to be specific). Here, it is preferred to completely cover the entire rear surface 12d of the semiconductor chip 12 by the adhesive material paste 11a from the view point of securely fixing the semiconductor chip 12 to the wiring substrate 4.

Here, a technology of reducing the gap that occurs when spreading the adhesive material paste 11a over the chip-mounting region 20a is required in order to suppress occurrence of a void (gap) between the semiconductor chip and the insulating film 26. In other words, it is necessary to effectively exhaust the gas existing between the semiconductor chip 12 and the chip-mounting region 20a to the outside of the chip-mounting region 20a. From the viewpoint of reducing the gap that occurs when spreading the adhesive material paste 11a, the shape and layout of the dummy wirings 23d of the present embodiment as shown in FIG. 8 is effective. The reason will be described above referring to the comparative example examined by the inventors of the present application.

<Examination of Comparative Examples>

Figure 32:
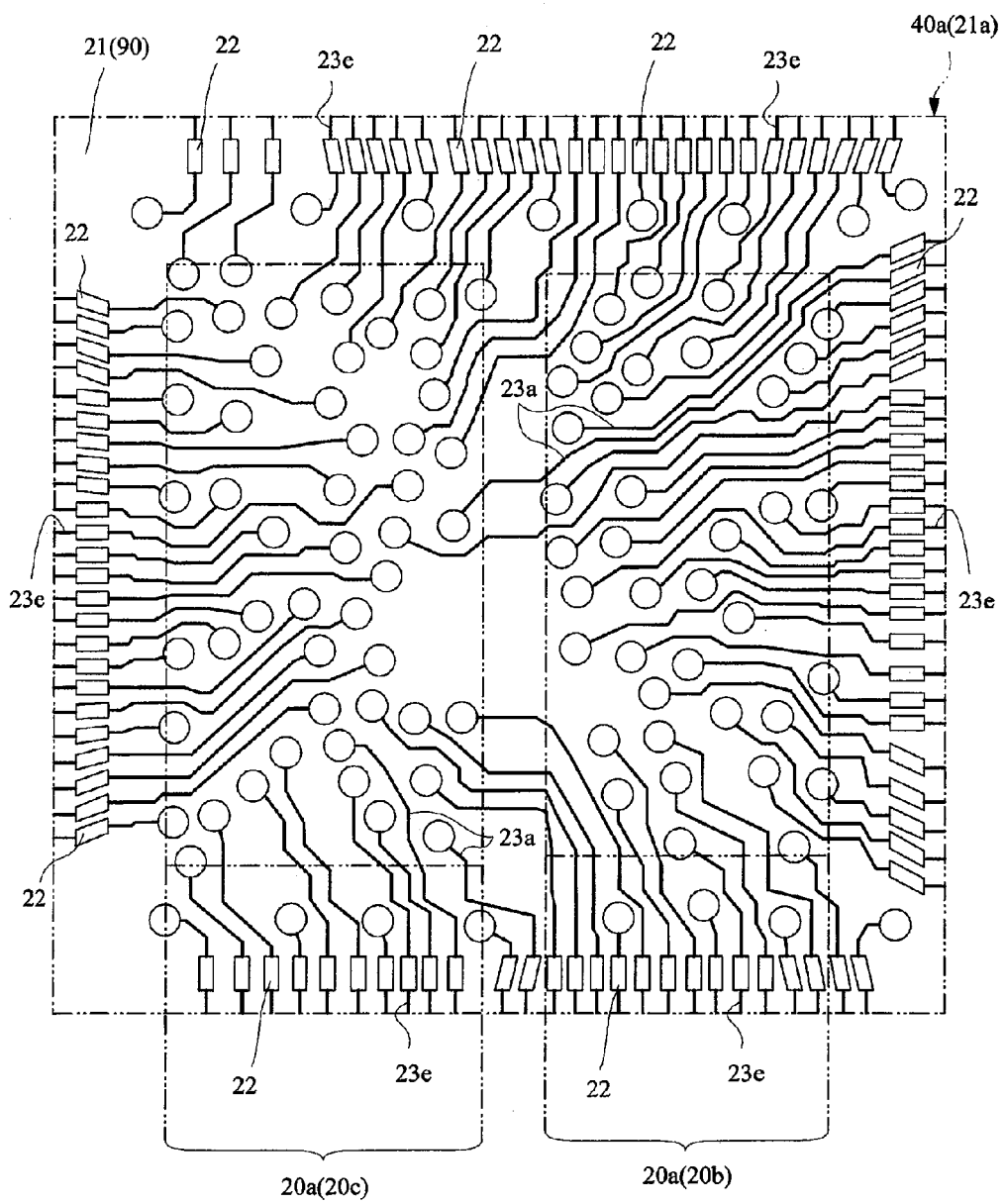
FIG. 32 is an enlarged planar view illustrating a wiring pattern on the upper surface side of the wiring substrate, which is a first comparative example of the wiring substrate shown in FIG. 8.

FIG. 32 is an enlarged planar view illustrating a wiring pattern on the upper surface side of the wiring substrate, which is a first comparative example of the wiring substrate shown in FIG. 8.

As can be seen in a wiring substrate 90 of an comparative example shown in FIG. 32, the inventors first pressed the semiconductor chip 12 against the wiring substrate 90 (see FIG. 32), as shown in FIG. 12, after performing the first adhesive material application step on a wiring substrate 90 which is different in that the dummy wirings 23d shown in FIG. 8 is not formed thereon. In this case, however, the inventors found that a void occurred between the semiconductor chip 12 and the wiring substrate 90 in a region having a wide pitch between the wirings 23a.

Figure 33:
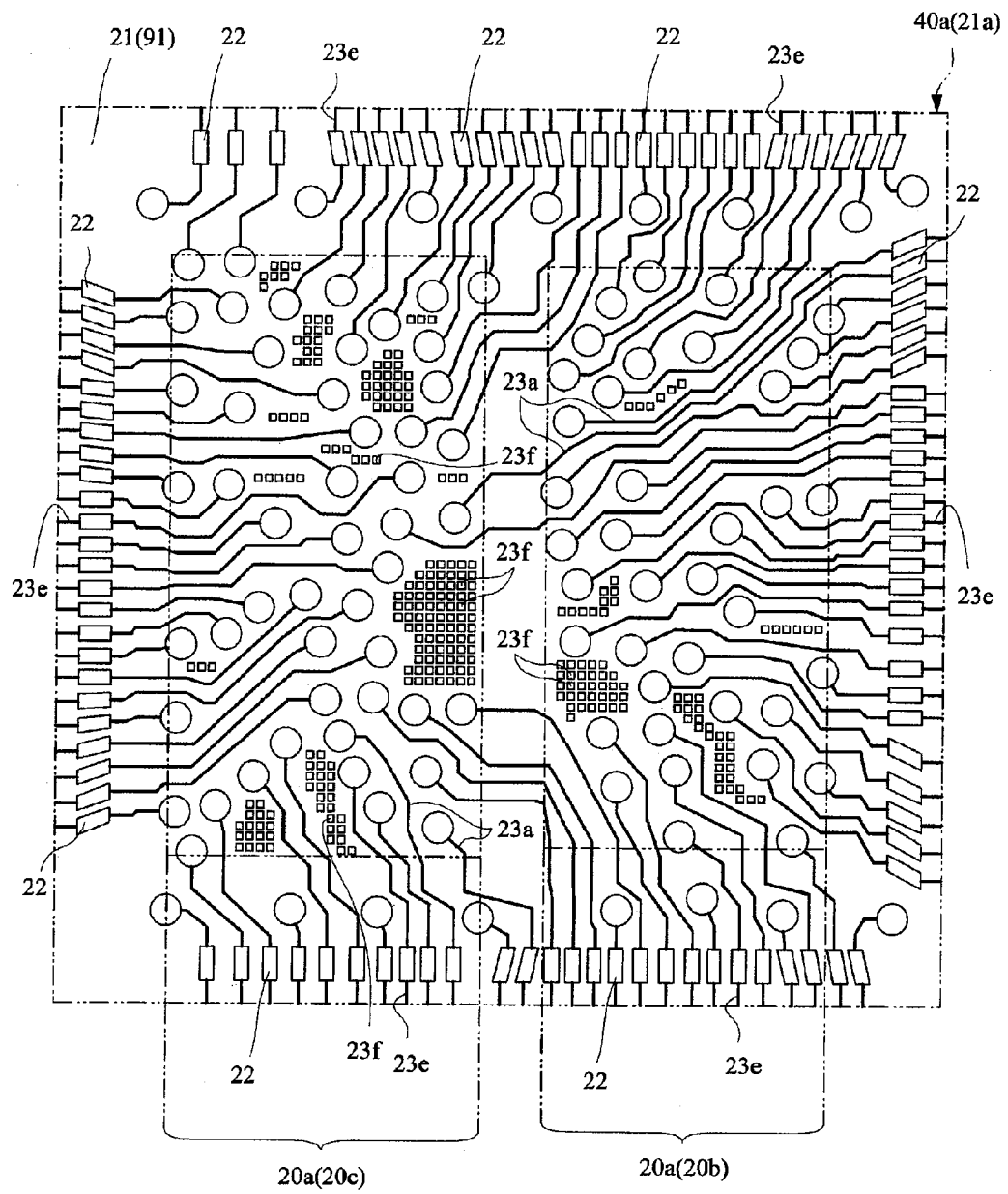
FIG. 33 is an enlarged planar view illustrating a wiring pattern on the upper surface side of the wiring substrate, which is a second comparative example of the wiring substrate shown in FIG. 8.

The inventors thought that the low flatness of the surface of the insulating film 26 (see FIG. 12) over the chip-mounting region 20a is the cause of the void and examined, for the purpose of improving the flatness, wiring substrate 91 having many dummy patterns 23f made of square planar shaped dot patterns arranged between the wirings 23a, as shown in FIG. 33. The dummy pattern 23f is formed by a similar method as that for the dummy wirings 23d shown in FIG. 8. The semiconductor chip 12 is also pressed against the wiring substrate 91 (see FIG. 33) as shown in FIG. 12 by a similar method as that for the wiring substrate 90 shown in FIG. 32. Also in this case, however, it has been found that a void occurred around the dummy patterns 23f made of the dot patterns. According to the examination of the inventors, the dummy patterns 23f failed to sufficiently exhaust the gas (e.g., air) existing between the chip-mounting region 20a and the semiconductor chip 12 (see FIG. 12) because the direction of exhausted gas is random.

<Description of Shape and Layout of Dummy Wirings of Present Embodiment>

From the above result, it has been found that occurrence of a void cannot be sufficiently suppressed by simply forming dummy patterns to improve the flatness of the surface of the insulating film 26 (see FIG. 14), when the amount of application of the adhesive material paste 11a (see FIG. 14 reference) is reduced. Through further examination, therefore, the inventors have found that, as shown in FIG. 8, occurrence of a void can be almost certainly suppressed by extending each of the dummy wirings 23a in the direction in which the adhesive material paste 11a (see FIG. 14) mainly spreads.

By forming the dummy wirings 23a linearly as in the present embodiment, unevenness is formed following the planar shape of the dummy wirings 23a in the surface of the insulating film 26 covering the dummy wirings 23a (see FIG. 13, for example). When spreading the adhesive material paste 11a shown in FIG. 9 around the adhesive material application region 11b, the gas (e.g., air) existing between the semiconductor chip 12 (see FIG. 12) and the insulating film 26 can easily move along the unevenness in the surface of the insulating film 26. Therefore, retention of gas over a part of the chip-mounting region 20a can be suppressed by extending each of the dummy wirings 23a in the direction in which the adhesive material paste 11a spreads. In other words, the gas (air) existing between the insulating film 26 and the semiconductor chip 12 can be guided and exhausted outside the chip-mounting region 20a. In this manner; the adhesive material paste 11a can liquefy and spread all over the entire chip-mounting region 20a.

The direction in which the adhesive material paste 11a spreads is the direction toward the circumference of the adhesive material application region 11b shown in FIG. 14. Since, in the present embodiment, the adhesive material application region 11b is applied to the centerline binding the centers of the short sides facing each other, among the four sides of the rectangular chip-mounting region 20a, the direction in which the adhesive material paste 11a spreads is mainly the direction from the adhesive material application region 11b toward each long side of the chip-mounting region 20a. Therefore, in the present embodiment, each of the dummy wirings 23d is extended along the short side of the chip-mounting region 20a. For the chip-mounting region 20a having a rectangular planar shape as in the present embodiment, the travel distance is shortened by exhausting the gas existing between the semiconductor chip 12 and the insulating film 26 toward the long side. In other words, gas can be easily exhausted. Therefore, the gas can be easily exhausted by extending each of the dummy wirings 23d along the short side of the chip-mounting region 20a. In other words, occurrence of a void due to retention of gas can be suppressed.

The adhesive material paste 11a spreads from the adhesive material application region 11b toward each short side of the chip-mounting region 20a in the vicinity of both edges of the adhesive material application region 11b extending in a band-like manner. For example, extension toward the short side results in a shorter distance to the outer edge of the chip-mounting region, in the vicinity of the short side of the chip-mounting region 20a shown in FIG. 8. In such a case, a part of the dummy wirings 23d near the short side, as shown in FIG. 8, may be extended along the long side of the chip-mounting region 20a, when forming the dummy wirings 23d in the vicinity of the short side. However, the amount of the adhesive material paste 11a spreading from the adhesive material application region 11b toward each short side of the chip-mounting region 20a is small in comparison with the amount of the adhesive material paste 11a spreading toward each long side. In addition, the distance from the edge to the short side of the adhesive material application region 11b extending in a band-like manner is very short. Therefore, as a modified example of FIG. 8, all the dummy wirings 23d may be extended along the short side of the chip-mounting region 20a.

Additionally, in the step of spreading the adhesive material paste 11a (semiconductor chip-mounting step), it is preferred from the viewpoint of shortening the travel distance of the gas that each of the dummy wirings 23d is extended generally linearly without having a bent portion. Bending the dummy wirings 23d elongates the travel distance of the gas over the chip-mounting region 20a, raising the possibility of occurrence of a void. Therefore, from the viewpoint of reducing occurrence of a void, it is preferred that each of the dummy wirings 23d is not bent. However, due to limitation of the layout of the wirings 23a, there may be a case that the gap between the wirings 23a is widened unless apart of the dummy wirings 23d which has a bent portion is included. In this case, a configuration including the dummy wirings 23d having a bent portion as shown in FIG. 8 may be employed.

In the chip-mounting region 20a, the dummy wirings 23d are arranged in a region where the distance between the wirings 23a is wide. This is because voids may easily occur in a region where the gap between wirings is large. In other words, comparison of the distance between the adjacent wirings 23a for both a dummy wiring arrangement region having the dummy wirings 23d arranged therein and a dummy wiring non-arrangement region having no dummy wiring 23d arranged therein shows that the distance between the wirings 23a in the dummy wiring arrangement region is wider than the distance between the wirings 23a in the dummy wiring non-arrangement region. Letting L denote the designed line width of each of the wirings 23a and S denote the designed interval between the adjacent wirings 23a in the present embodiment, for example, one or more of the dummy wirings 23d are arranged between the adjacent wirings 23a in a region where a gap wider than 3×S may be generated in terms of the wiring layout. Since the distance between the wirings 23a is narrow in the dummy wiring non-arrangement region, and each of the wirings 23a is extended toward the terminal 22 and formed inside and outside the chip-mounting region 20a, occurrence of a void is suppressed.

Additionally, from the viewpoint of effectively guiding the gas over the chip-mounting region 20a, it is preferred that each of the dummy wirings 23d is formed successively. In other words, it is preferred that no other dummy wiring 23d is arranged adjacently in the direction of extension of the dummy wirings 23d. Furthermore, it is preferred that each of the dummy wirings 23d is not divided between the adjacent wirings 23a. When the gap in the dummy wiring arrangement region is wide as shown in FIG. 8, however, the dummy wirings 23d having an aligned extending direction may be arranged generally in parallel.

Additionally, from the viewpoint of effectively guiding the gas over the chip-mounting region 20a, it is preferred that the thickness of each dummy wiring 23d is the same as that of each wiring 23a. Since the wirings 23a and the dummy wirings 23d are integrally formed by electrolytic plating as described above in the present embodiment, it is easy to render their thickness to be the same. Additionally, in the present embodiment, the line width of each dummy wiring 23a (line width of the linear part of the wiring 23a, to be specific) is the same as the line width of each wiring 23a. As a modified example, the line width of each dummy wiring 23a can be rendered narrower than the line width of each wiring 23a (line width of the linear part of the wirings 23a, to be specific).

Additionally, in FIG. 8, the dummy wirings 23d are arranged in the chip-mounting region 20a in planar view but are not extended outside of the chip-mounting region 20a. According to an experiment of the inventors, occurrence of a void can be suppressed without having to extend the dummy wirings 23d outside of the chip-mounting region 20a as shown in FIG. 8. However, in a region where the distance from the adhesive material application region 11b (see FIG. 9) is far, it is preferred from the viewpoint of suppressing occurrence of a void to extend the dummy wirings 23d to the vicinity of the outer edge of the chip-mounting region 20a. In addition, a configuration in which the dummy wirings 23d are extended to the outside of the chip-mounting region 20a may be employed.

Additionally, from the viewpoint of spreading the adhesive material paste 11a without a gap, the dummy wirings 23d may be coupled to the wirings 23a. However, from the viewpoint of preventing degradation of the electric characteristic of the current flowing through the wirings 23a, it is preferred that the dummy wirings 23d and the wirings 23a are separated, and thus the dummy wirings 23d and the wirings 23a are respectively formed in a spaced apart manner in the present embodiment.

As thus described, in the present embodiment, the adhesive material paste 11a can be spread without a gap, as shown in FIG. 12, even if the amount of application of the adhesive material paste 11a is reduced, by forming the dummy wirings 23d in the chip-mounting region 20a as shown in FIG. 8. Although the thickness of the adhesive material paste 11a is depicted to be thick in FIG. 12 for illustrative purpose, the adhesive material paste 11a is 10 μm thick, for example, which is extremely thin in comparison with the semiconductor chip 12 (150 μm). Therefore, the necessary amount of the adhesive material paste 11a used for mounting the semiconductor chip 12 can be reduced, thereby saving resources.

In addition, since the groove 26b is formed around the chip-mounting region 20a in the present embodiment, spreading of a part of the adhesive material paste 11a to the terminals 22 can be prevented. However, it is difficult to spread the adhesive material paste 11a over a wide area when thinly spreading the adhesive material paste 11a as in the present embodiment, a modified example of the present embodiment may be employed in which the groove 26b is not formed.

Figure 15:
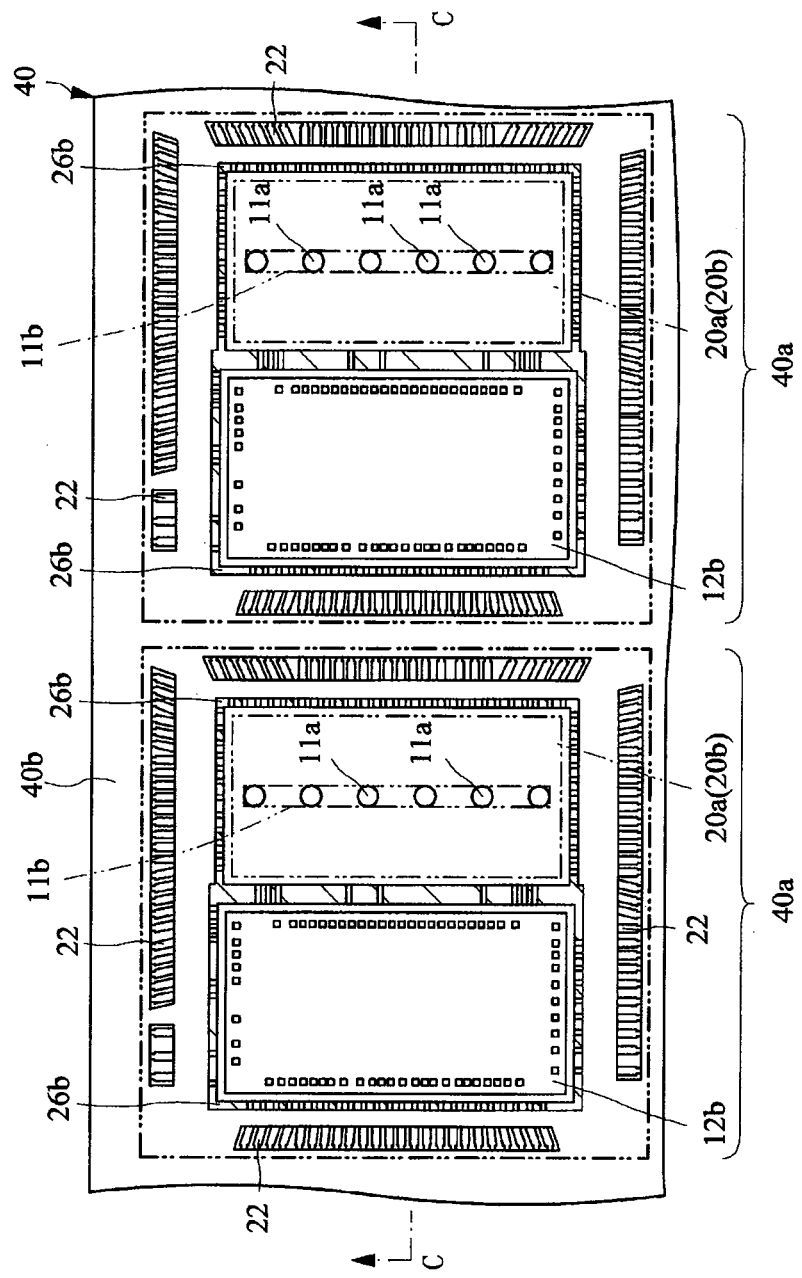
FIG. 15 is an enlarged planar view illustrating a second adhesive material application step in the die bonding step shown in FIG. 5.
Figure 16:
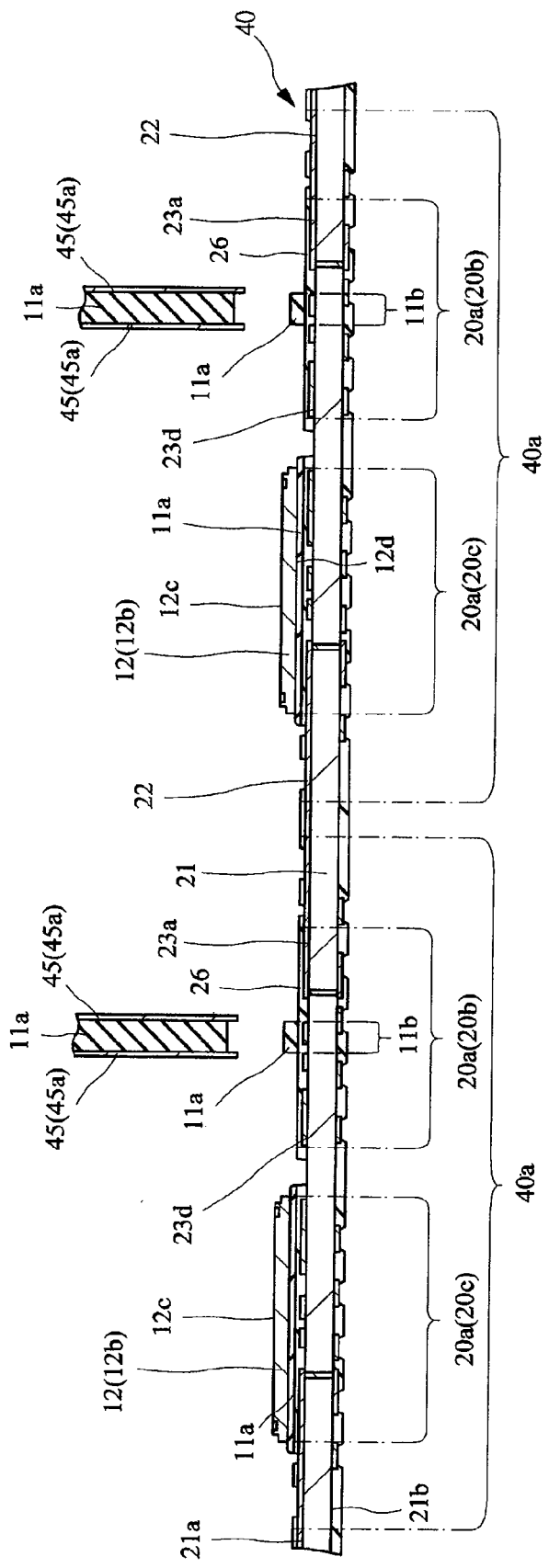
FIG. 16 is an enlarged cross-sectional view taken along line C-C of FIG. 15.

Next, in the second adhesive material application step, the adhesive material paste 11a is applied to another chip-mounting region 20a different from the chip-mounting region 20a having the semiconductor chip 12 already mounted thereon, as shown in FIGS. 15 and 16. In the present embodiment, the adhesive material paste 11a is applied to the chip-mounting region 20b for mounting the AFE chip 12a (see FIG. 2). FIG. 15 is an enlarged planar view illustrating a second adhesive material application step in the die bonding step shown in FIG. 5, and FIG. 16 is an enlarged cross-sectional view taken along line C-C of FIG. 15.

Since the material composing the adhesive material paste 11a used in this step and the position and shape of coating (applying) the adhesive material paste 11a are similar to those in the first adhesive material application step, duplicate description thereof is omitted.

Figure 17:
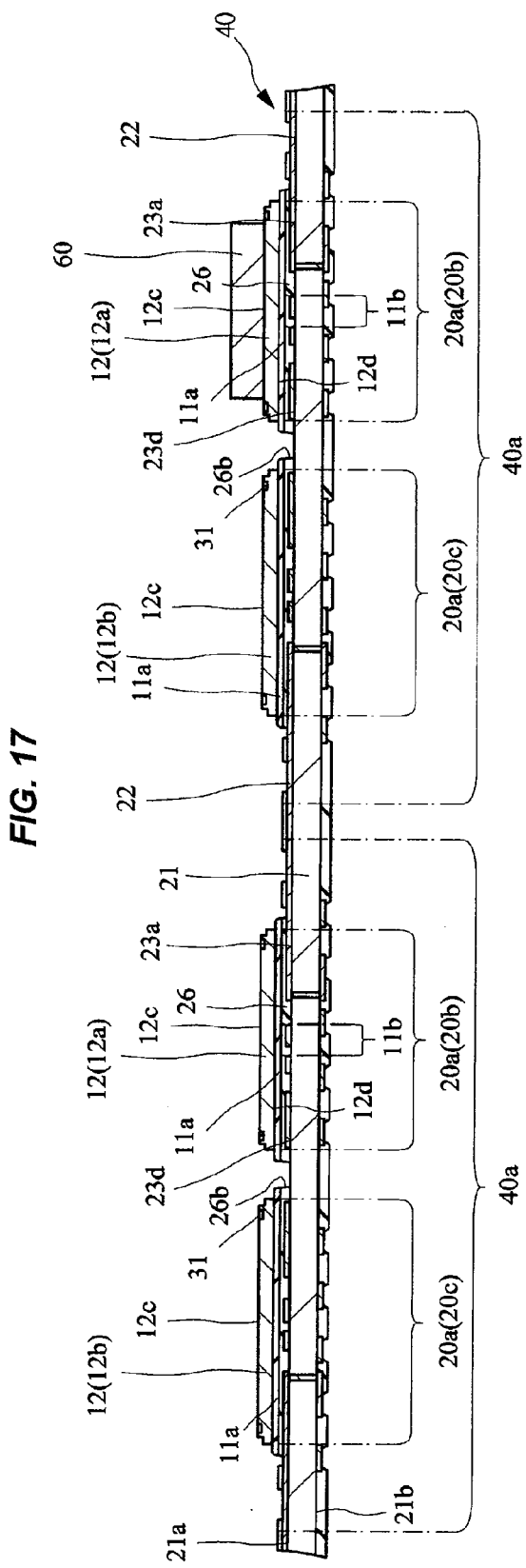
FIG. 17 is an enlarged cross-sectional view illustrating a step of mounting a semiconductor chip in a chip-mounting region of the wiring substrate shown in FIG. 16.

Next, in the second semiconductor chip-mounting step, the semiconductor chip 12 is mounted in the chip-mounting region 20a of the wiring substrate 40, as shown in FIG. 17. In the present embodiment, the AFE chip 12a is mounted in the chip-mounting region 20b. The semiconductor chip 12 is mounted in the chip-mounting region 20a so that the rear surface 12d of the semiconductor chip 12 faces the upper surface 21a of the chip-mounting region (face-up installation). FIG. 17 is an enlarged cross-sectional view illustrating a step of mounting a semiconductor chip in a chip-mounting region of the wiring substrate shown in FIG. 16.

Since this step mounts the AFE chip 12a by a procedure similar to that of the first semiconductor chip-mounting step, duplicate description thereof is omitted. When mounting the AFE chip 12a in the chip-mounting region 20b, the VDR chip 12b has already been mounted in the neighboring chip-mounting region 20c. In recent years, semiconductor chips tend to be thinner, some of which having a thickness of 0.15 mm or less, like the semiconductor chips 12 of the present embodiment. Therefore, when a large amount of the adhesive material paste 11a is applied, there is a concern that the adhesive material paste 11a applied under the AFE chip 12a may liquefy and spread as far as the chip-mounting region 20c having the VDR chip 12b mounted therein. A part of the adhesive material paste 11a may crawl up to the surface 12c of the VDR chip 12b so that a part of or all over the pad 31 of the VDR chip 12b is covered with the adhesive material paste 11a. In the present embodiment, however, only a small amount of the adhesive material paste 11a is applied in the second adhesive material application step. For example, the total amount (total amount of application) of the adhesive material paste 11a applied to one of the chip-mounting regions 20b is about 0.1 mg, and the thickness of the adhesive material paste 11a spread in the chip-mounting region 20b is about 10 μm. Therefore, it is possible to prevent the adhesive material paste 11a applied under the AFE chip 12a from liquefying and spreading as far as the chip-mounting region 20c having the VDR chip 12b mounted therein. Furthermore, this can be reliably prevented in the present embodiment because of the groove 26b formed between the chip-mounting regions 20b and 20c. Additionally, in the present embodiment, the dummy wirings 23d are also arranged in the lower layer of the chip-mounting region 20b similarly to the chip-mounting region 20c, as shown in FIG. 8. Therefore, the adhesive material paste 11a can be spread all over the entire chip-mounting region 20b without a gap even if the amount of application of the adhesive material paste 11a is reduced. In this manner, occurrence of a void can be prevented or suppressed. Since the preferred shape and layout of the dummy wiring 23d is identical to those described with the chip-mounting region 20c, duplicate description thereof is omitted.

Next, in a baking step, the wiring substrate 40 having the semiconductor chip 12 mounted therein is heated to cure the adhesive material paste 11a. In the baking step, the wiring substrate having the semiconductor chip 12 for example mounted therein is transported to a baking furnace and cured at a temperature higher than the curing temperature of the adhesive material paste 11a. Curing thermosetting resin ingredient of the adhesive material paste 11a forms the adhesive material 11 shown in FIG. 3, whereby the semiconductor chip 12 is securely fixed over the insulating film 26.

In the present embodiment, the second adhesive material application step is performed after mounting the VDR chips 12b in the chip-mounting regions 20. The reason is to prevent occurrence of failure of the adhesive material paste 11a applied to the chip-mounting region 20a while switching the type of the semiconductor chip 12 to be mounted. However, the order of the steps described in the present embodiment may be changed when a die bonding device capable of mounting a plurality of types of semiconductor chips in parallel is used. For example, the first and second semiconductor chip-mounting steps may be performed after having performed the first and the second adhesive material application steps. In this case, the adhesive material application step can be collectively performed because a plurality of types of the semiconductor chips 12 are mounted, although this may lead to making the die bonding device more complex and larger.

In addition, a baking step can be performed between the first semiconductor chip-mounting step and the second adhesive material application step. In this case, the second semiconductor chip-mounting step can be performed with the VDR chip 12b already fixed on the insulating film 26. However, since a step of transporting the wiring substrate 40 in the middle of the die bonding step is added in this case, it is preferred to perform the baking step after the second semiconductor chip deployment step has been completed as in the present embodiment from the viewpoint of preventing the manufacturing step from being complicated.

Figure 18:
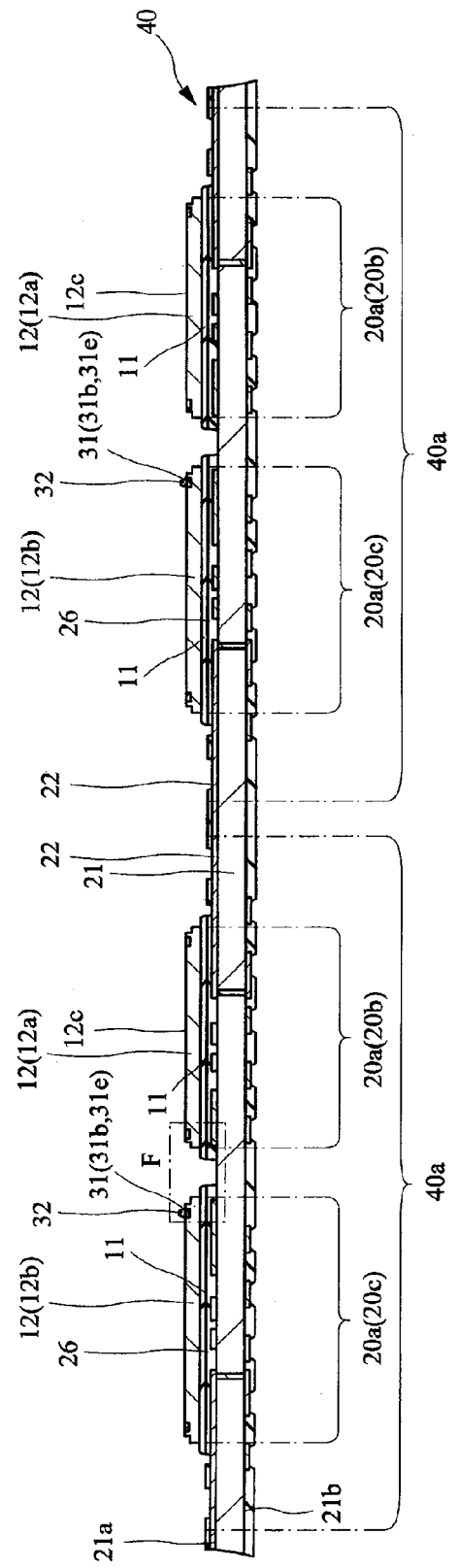
FIG. 18 is an enlarged cross-sectional view illustrating a projecting electrode forming step in the wire bonding step shown in FIG. 5.
Figure 19:
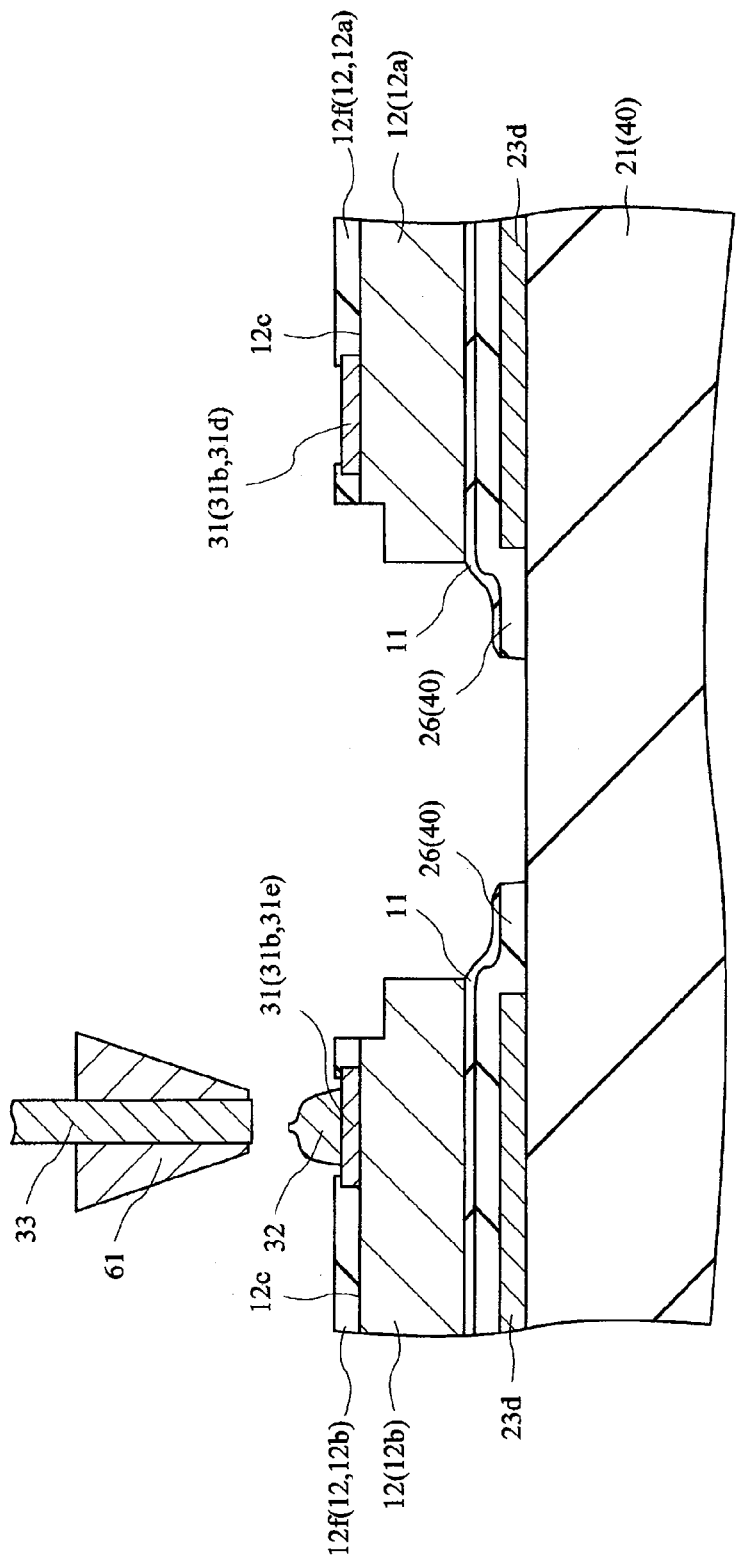
FIG. 19 is an enlarged cross-sectional view further enlarging the part F of FIG. 18.
Figure 20:
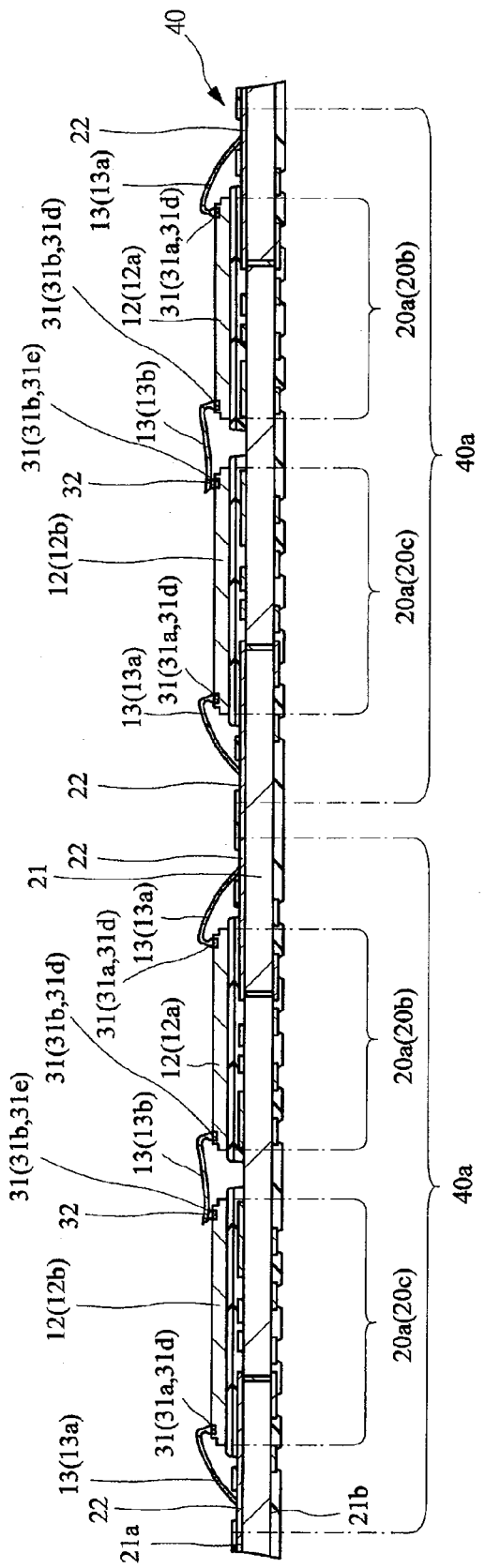
FIG. 20 is an enlarged cross-sectional view illustrating the wire bonding step shown in FIG. 5.

4. Wire Bonding Step;

Next, a wire bonding step S4 shown in FIG. 5 will be described. FIG. 18 is an enlarged cross-sectional view illustrating a projecting electrode forming step in the wire bonding step shown in FIG. 5, and FIG. 19 is an enlarged cross-sectional view further enlarging the part F of FIG. 18. FIG. 20 is an enlarged cross-sectional view illustrating the wire bonding step shown in FIG. 5.

In the present embodiment, chip-to-chip coupling is performed between the pads 31 exposing from the insulating film (passivation film) 12f of the semiconductor chip 12. Therefore, as shown in FIGS. 18 and 19, a stud bump (projecting electrode, bump electrode) 32 is formed on the pad 31 of the semiconductor chip 12 (VDR 12b shown in FIGS. 17 and 19) being the second bonding side of the chip-to-chip coupling as a projecting electrode forming step. Specifically, a stud bump 32 is formed on the pad 31e being the second bonding side in the wire bonding step as shown in FIG. 19, but not on the pad 31d being the first bonding side.

The wire bonding technology can be applied to the method of forming the stud bump 32. In the present embodiment, the stud bump 32 is formed by the ball bonding method, in which the tip of a wire 33 made of gold for example is formed into the shape of a ball using an electric torch (not shown), then pressed and joined by a capillary 61. In order to join the pad 31e to the stud bump 32, there are the thermo-compression bonding method, the supersonic wave method using vibration of a supersonic wave, and a combined method using them in combination, of which the present embodiment uses the combined method.

Next, in the wire bonding step as shown in FIG. 20, electrical coupling is provided between two chips, and between a chip and a wiring substrate, respectively. In this step, wire bonding is performed by the so-called positive bonding with the pad 31 of the semiconductor chip 12 being the first bonding side, and the terminal 22 of the wiring substrate 40 being the second bonding side of the coupling between the chip and the wiring substrate. Additionally, in the chip-to-chip coupling, wire bonding is performed with the pad 31d of the AFE chip 12a being the first bonding side and the pad 31e of the VDR chip 12b being the second bonding side.

The wire bonding method is performed in a similar manner as the projecting electrode forming step. Referring to FIG. 19, the tip of wire 33 made of gold for example is formed into the shape of a ball using an electric torch (not shown), then pressed and joined by the capillary 61 to the pad 31d being the first bonding side. The joining method uses the supersonic wave method and thermo-compression bonding method in combination. Subsequently, a wire loop shape is formed by moving the capillary 61 to the second bonding side while sending the wire 33 out, and joined to the metal part being the second bonding side (the stud bump 32 in FIG. 19). Upon cutting the wire 33 after having joined the second bonding side, electrical coupling is provided between the pads 31b of the two semiconductor chips 12 via the wire 13. Although the capillary is not shown, similarly for the coupling between the chip and the wiring substrate, the pad 31a and the terminal 22 are electrically coupled via the wire 13 as shown in FIG. 20.

The wire 13 and the stud bump 32 are made of metal, which is gold (Au) for example, in the present embodiment. Therefore, the adhesiveness between the wire 13 and the pad 31 can be improved by applying gold (Au) to the surface of the pad 31 of the semiconductor chip 12 as stated above. In addition, a gold (Au) film is also formed on the surface of the terminal 22 as stated above, whereby the adhesiveness between the wire and the terminal 22 can be improved.

Figure 21:
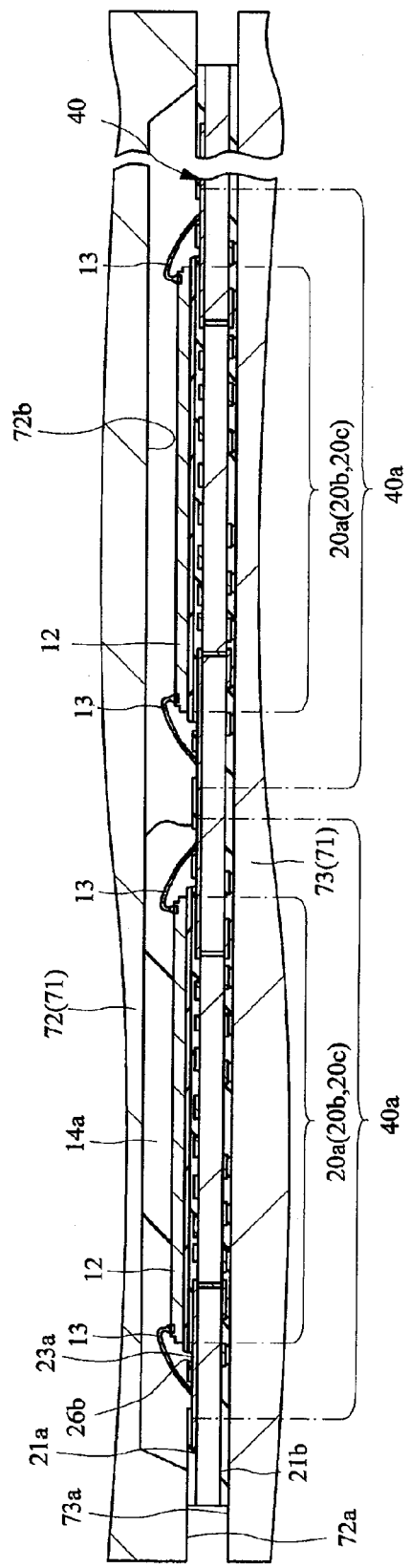
FIG. 21 is an enlarged cross-sectional view illustrating the state in which a wiring substrate is placed in a molding die used in a sealing step and sealing resin is supplied thereto.
Figure 22:
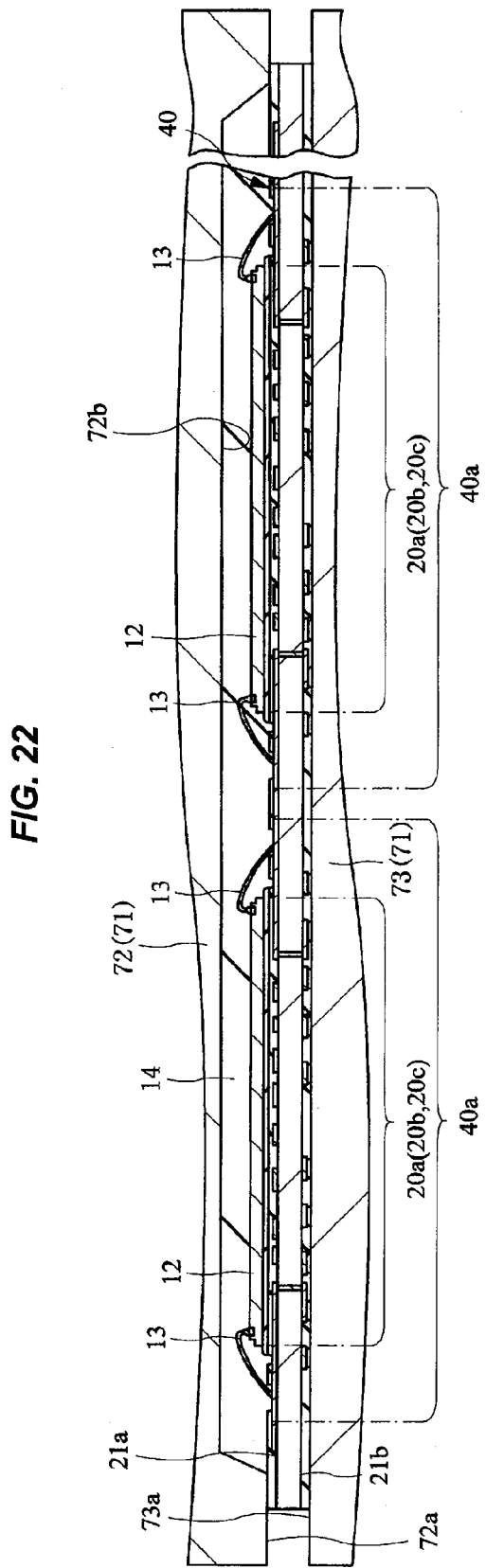
FIG. 22 is an enlarged cross-sectional view illustrating a state in which the sealing resin is cured after the cavity shown in FIG. 21 has been filled with the sealing resin.

5. Sealing Step;

Next, the sealing step S5 shown in FIG. 5 will be described. FIG. 21 is an enlarged cross-sectional view illustrating the state in which a wiring substrate is applied to a molding die used in a sealing step and sealing resin is supplied thereto. FIG. 22 is an enlarged cross-sectional view illustrating a state in which the sealing resin is cured after the cavity shown in FIG. 21 has been filled with the sealing resin.

The sealing step includes a die provision step which provides a molding die, a base material provision step which places a wiring substrate having a semiconductor chip thereon into the molding die, a clamping step which clamps the wiring substrate by the molding die, a sealing body forming step which provides sealing resin into a cavity of the molding die to form a sealing body, and a base material extracting step which extracts the wiring substrate from the molding die.

The present embodiment will describe a manufacturing method referred to as the so-called MAP (Mold Allay Step) which places a wiring substrate having a plurality of product formation regions arranged in a matrix within a single cavity and collectively seals the product formation regions.

As shown in FIG. 21, a molding die 71 to be provided in the die provision step comprises an upper die (die) 72 having a lower surface 72a and a cavity (concave, dent) 72b formed on the lower surface 72a, and a lower die (die) 73 having an upper surface 73a facing the lower surface 72a.

The cavity 72b has a quadrangular planar shape. On the upper die 72, there are formed a plurality of gates (not shown) along one side of the cavity 72b, and a plurality of air vents (not shown) along the opposing side, respectively.

Next, in the base material provision step, the wiring substrate 40 is provided on the lower die 73 of the molding die 71. The cavity 72b formed on the upper die 72 to be combined with the lower die 73 has a wider area than the device regions 40a of the wiring substrate 40. In this step, the wiring substrate 40 is provided so that the device regions 40a are received within a single cavity 72b.

Next, in the clamping step, the distance between the upper die 72 and the lower die 73 is shortened so that the wiring substrate 40 is clamped between the upper die 72 and the lower die 73.

Next, in the sealing body forming step, sealing resin is supplied to the cavity 72b and cured to form a sealing resin. In this step, the sealing resin is formed by a transfer mold method in which a resin tablet provided on a pot (not shown) is heat-softened to supply sealing resin from a gate (not shown) into the cavity 72b. The resin tablet is made of epoxy resin, a type of thermosetting resin, for example, having a characteristic that it softens by heating at a lower temperature than the curing temperature, resulting in improved flowability. Therefore, pushing the softened resin tablet into the molding die 71 using a plunger (not shown) for example causes the sealing resin to flow from the gate formed in the molding die 71 into the cavity 72b (specifically, the upper surface 21a side of the wiring substrate 40). The gas in the cavity 72b is exhausted from the air vent (not shown) by the pressure force exerted by the flow of the sealing resin thereinto, whereby the cavity 72b is filled with the sealing resin 14a. As a result, the semiconductor chips 12 mounted on the upper surface 21a side of the wiring substrate 40 and the wires 13 are sealed by the sealing resin 14a. In this occasion, since the sealing resin 14a is buried also in the groove 26b, the wirings 23a that were exposed in the groove 26b are sealed.

Subsequently, heating inside the cavity 72b causes the sealing resin 14a to be thermo-set (tentatively cured), thereby forming the sealing body 14 shown in FIG. 22.

Next, in the base material extraction step, the wiring substrate 40 having the sealing body 14 shown in FIG. 22 is extracted from the molding die 71 used in the above-mentioned sealing step.

In this step, the lower surface 72a of the upper die 72 and the upper surface 73a of the lower die 73, shown in FIG. 22, are separated to extract the integrated sealing structure having the sealing body 14 formed thereon. Additionally in this step, resin burr generated in the sealing step is removed as necessary.

6. Baking Step;

Next, the baking step S6 shown in FIG. 5 will be described. The wiring substrate 40 extracted from the molding die 71 is first transported to a baking furnace (not shown) to put the wiring substrate 40 through a heating step again. The sealing resin 14a heated in the molding die 71 turns into a state referred to as the so-called tentative curing, in which half or more (e.g., around 70%) of the curing ingredient of the resin under curing is cured. In the tentative curing state, although not all the curing ingredient in the resin has been cured, more than half of the curing ingredient has been cured, at which point the semiconductor chip 12 and the wire 13 have been sealed. However, since it is preferred from the viewpoint of stabilizing the strength of the sealing body 14 to completely cure all the curing ingredient, so-called full curing in which the tentatively cured sealing body 14 is heated again is performed in the baking step S6. By dividing the step of curing the sealing resin 14a into two phases as thus described, the sealing step can be quickly performed on the next wiring substrate 40 to be transported to the molding die 71 subsequently, whereby efficiency of manufacturing can be improved.

Figure 23:
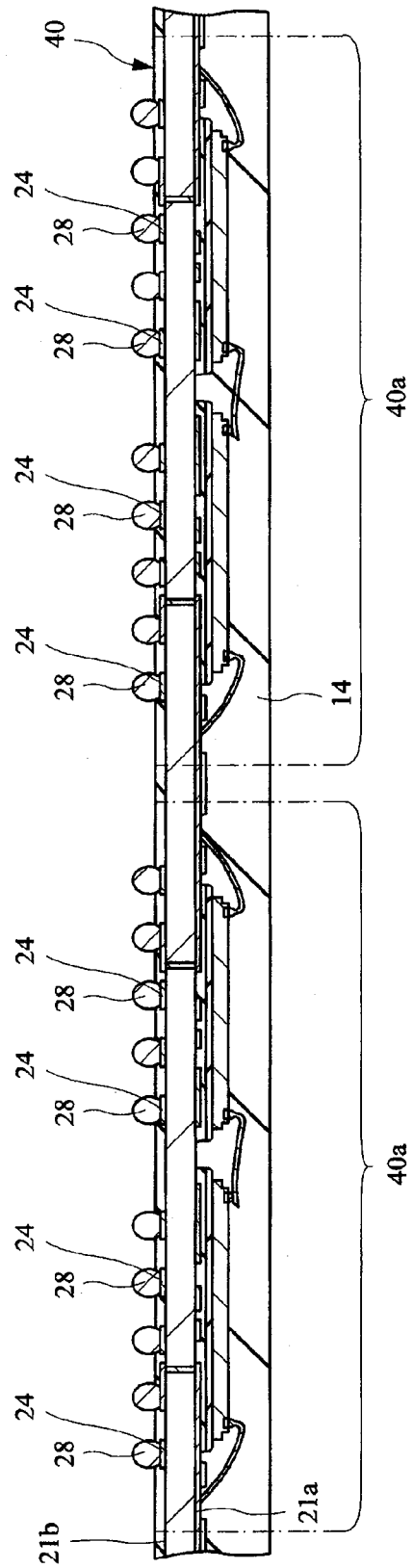
FIG. 23 is an enlarged cross-sectional view illustrating a state in which a plurality of solder balls is joined to the wiring substrate.

7. Ball Mounting Step;

Next, the ball mounting step S7 shown in FIG. 5 will be described. FIG. 23 is an enlarged cross-sectional view illustrating a state in which a plurality of solder balls is joined to the wiring substrate. Here FIG. 23 corresponds to the cross section taken along lone C-C shown in FIG. 9.

In this step, a plurality of solder materials (solder balls) 28 are mounted on each of the lands 24 formed on the lower surface 21b of the wiring substrate 40 shown in FIG. 23. Specifically, the top and bottom of the wiring substrate 40 is first reversed as shown in FIG. 23, and the solder materials 28 are respectively provided on the lands 24 formed on the lower surface 21b of the wiring substrate 40. Subsequently, the wiring substrate 40 having the solder materials 28 provided thereon is subjected to heat-processing (reflow), whereby the solder materials 28 are melted and respectively joined to the lands 24. In this occasion, since a plating layer is formed on the surface of the lands 24 as depicted above so that the surface of the lands 24 made of copper is difficult to be oxidized, degradation of wettability of the solder materials 28 against the lands 24 can be suppressed.

This step uses an activator referred to as flux, for example, in order to securely join the lands 24 to the solder materials 28. When flux is used for the joining, cleaning is performed after the heat-processing to remove the residual of the flux ingredient.

Figure 24:
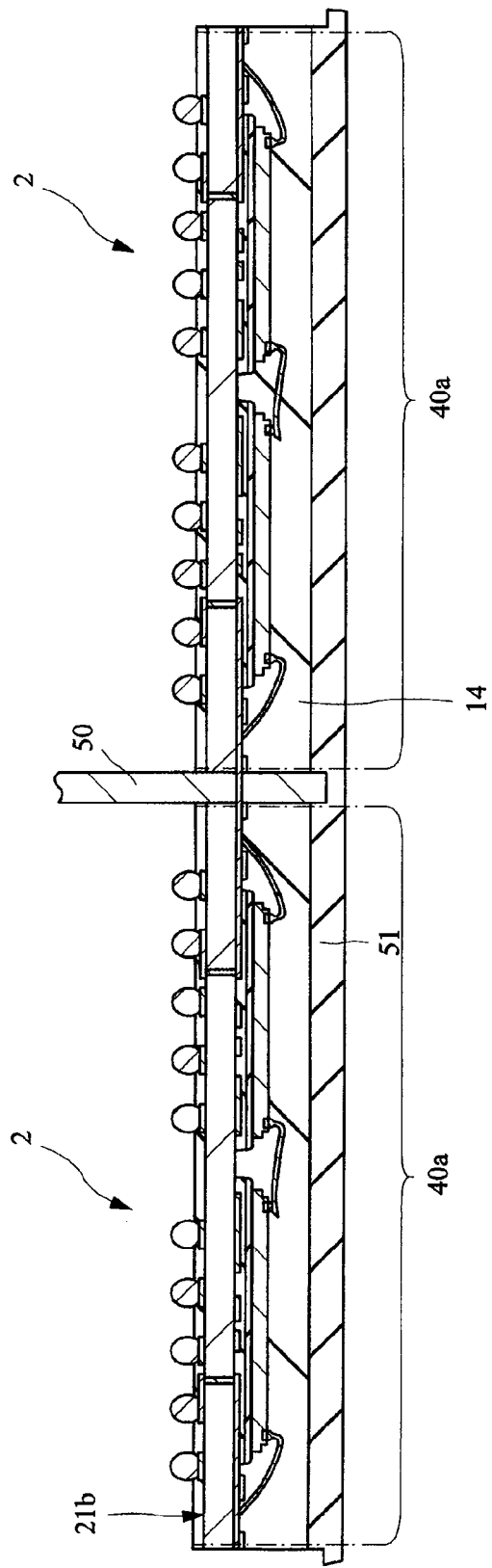
FIG. 24 is an enlarged cross-sectional view illustrating the step of dividing the wiring substrate and the sealing body shown in FIG. 23 into pieces.

8. Division into Pieces Step;

Next, the division into pieces step S8 shown in FIG. 5 will be described. FIG. 24 is an enlarged cross-sectional view illustrating the step of dividing the wiring substrate and the sealing body shown in FIG. 23 into pieces.

In this step, the wiring substrate 40 (see FIG. 23) and the sealing body 14 are cut and divided (division into pieces) for each of the regions 40a as shown in FIG. 24, for example, by moving a dicing blade 50 which is a cutting jig along the boundary line (dicing line) of the device regions 40a. This step yields a plurality of the semiconductor devices 2 shown in FIG. 3 from a single wiring substrate.

The present step is performed subsequent to the above-mentioned ball mounting step S7, for example, with the top and bottom of the wiring substrate 40 being reversed, which is cut from the lower surface 21b side, with the resin film (dicing tape) 51 adhered to the bottom (i.e., at the side of the sealing body 14).

Subsequently, requisite inspections and examinations such as appearance check are performed, and the semiconductor device 2 is completed.

Although description of the invention made by the inventors has been provided above based on embodiments thereof, it is needless to say that the invention is not limited to the embodiments and may be modified in various ways without deviating from its spirit.

Modified Example 1

Figure 25:
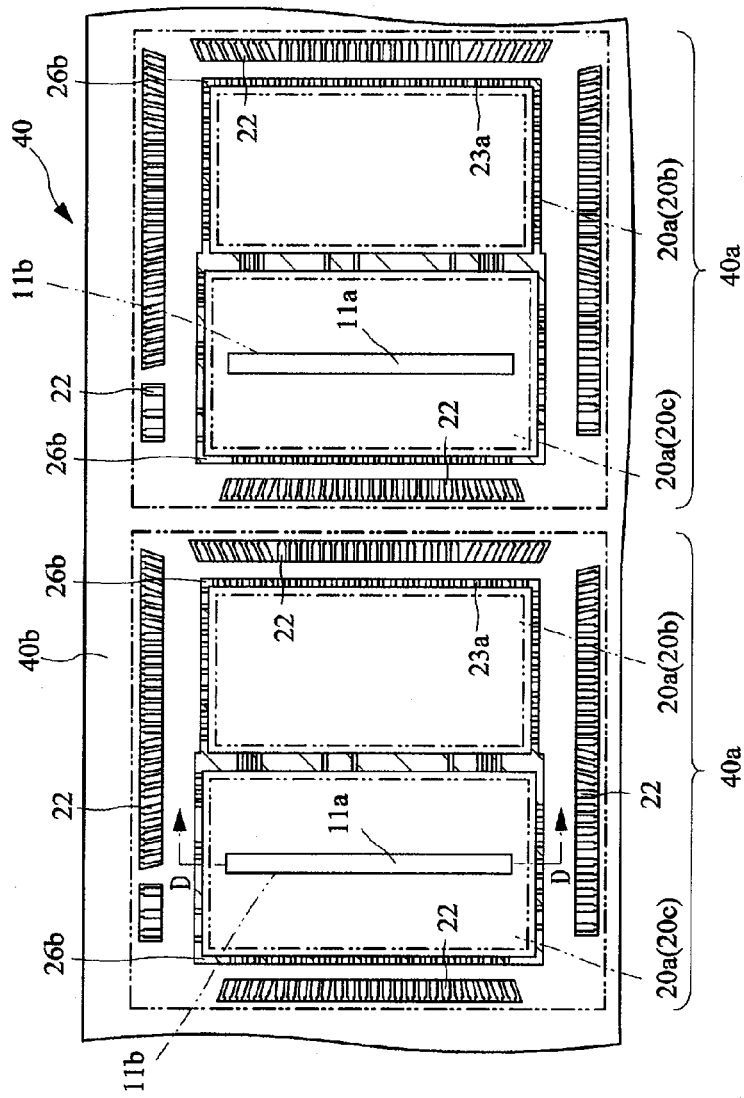
FIG. 25 is an enlarged planar view illustrating a modified example of FIG. 9.

In the above-mentioned embodiment, a multi-point application method has been described, as the first and the second adhesive material application step, which uses the nozzle 45 comprising the branched outlets 45a to apply the adhesive material paste 11a to a plurality of positions on the chip-mounting region 20a (on the adhesive material and the adhesive material application region 11b) as shown in FIG. 11. However, the application method of the adhesive material paste 11a is not limited to the above, and may be the band-shaped application method shown in FIGS. 25 and 26, for example. FIG. 25 is an enlarged planar view illustrating a modified example of FIG. 9, and FIG. 26 is an enlarged cross-sectional view illustrating a modified example of FIG. 11.

Figure 26:
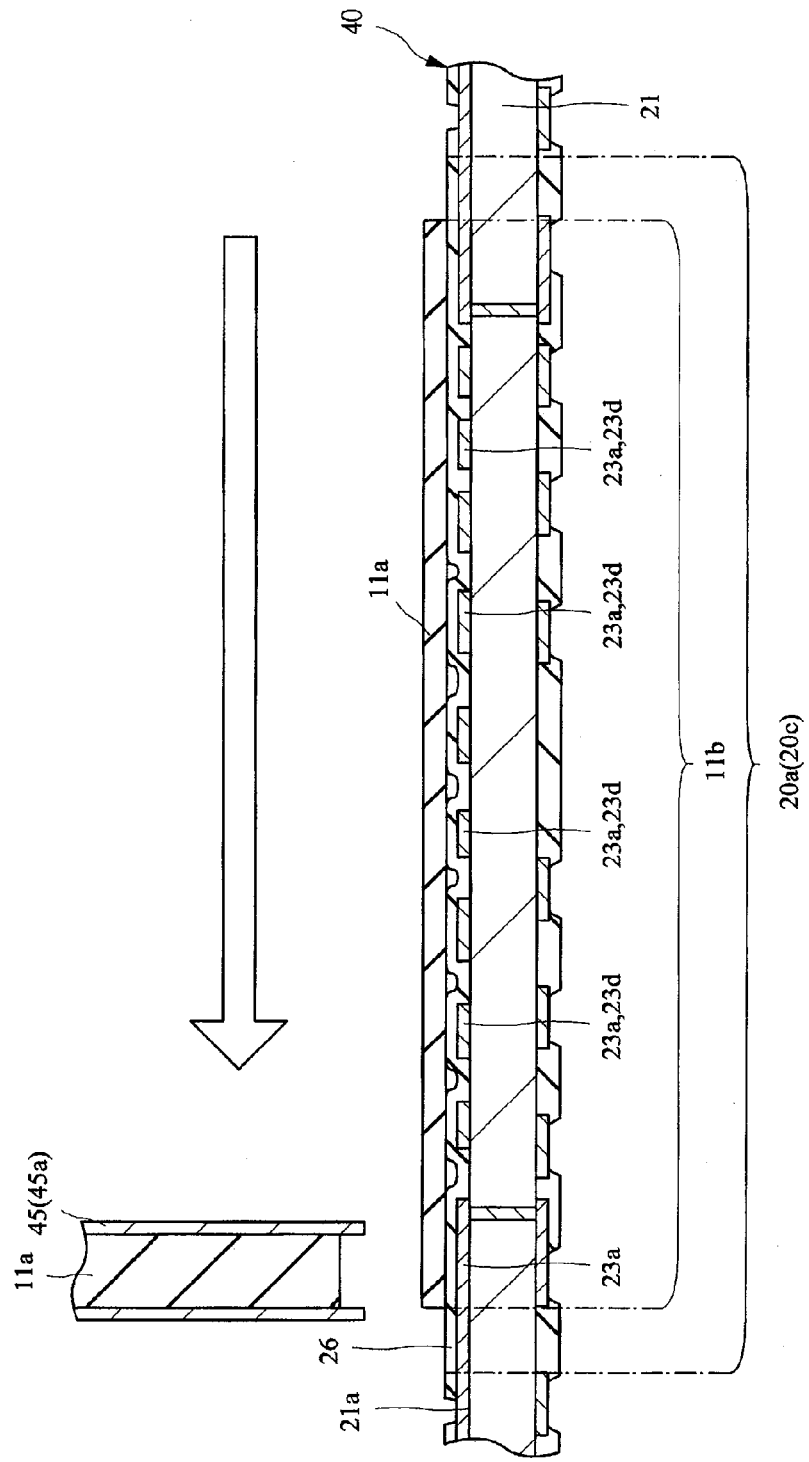
FIG. 26 is an enlarged cross-sectional view illustrating a modified example of FIG. 11.

In the modified example shown in FIG. 26, the nozzle with the unbranched outlet 45a is scanned in the direction indicated by an arrow in FIG. 26 to coat the adhesive material paste 11a in a band-like manner. In this case, the multi-point application method is preferred in terms of efficiency of manufacturing because of the necessary scanning time in comparison with the multi-point application method described in the above-mentioned embodiment. However, it is possible to suppress generation of a gap between the areas of the adhesive material paste 11a which may lead to occurrence of a void with the band-shaped application method.

Modified Example 2

Although an example has been described in the above-mentioned embodiment in which the dummy wirings 23d are arranged in the lower layers of both the chip-mounting regions 20b and 20c, a configuration such that the dummy wirings 23d are formed on the lower layer of either one of the chip-mounting regions 20b or 20c may be employed. In this case, it is preferred that the dummy wirings 23d are formed on the chip-mounting region 20b on which the semiconductor chip 12 is mounted later. This is because mounting the AFE chip 12a (the semiconductor chip 12) later on the chip-mounting region 20b arranged on the dummy wirings 23d can prevent the adhesive material paste 11a from crawling up to the surface 12c of the VDR chip 12b (the semiconductor chip 12) which has already been mounted thereon.

Modified Example 3

Although an example has been described in the above-mentioned embodiment in which the semiconductor chips 12 are arranged side by side, it is also applicable to an embodiment in which a single semiconductor chip 12 is mounted on the wiring substrate 40. In this case, though manufacturing a thinner semiconductor chip 12 may cause the adhesive material paste 11a to crawl up to the surface 12c, it can be prevented or suppressed by applying a step of mounting one of the semiconductor chips 12, among the die bonding steps described in the above-mentioned embodiment.

Modified Example 4

Figure 27:
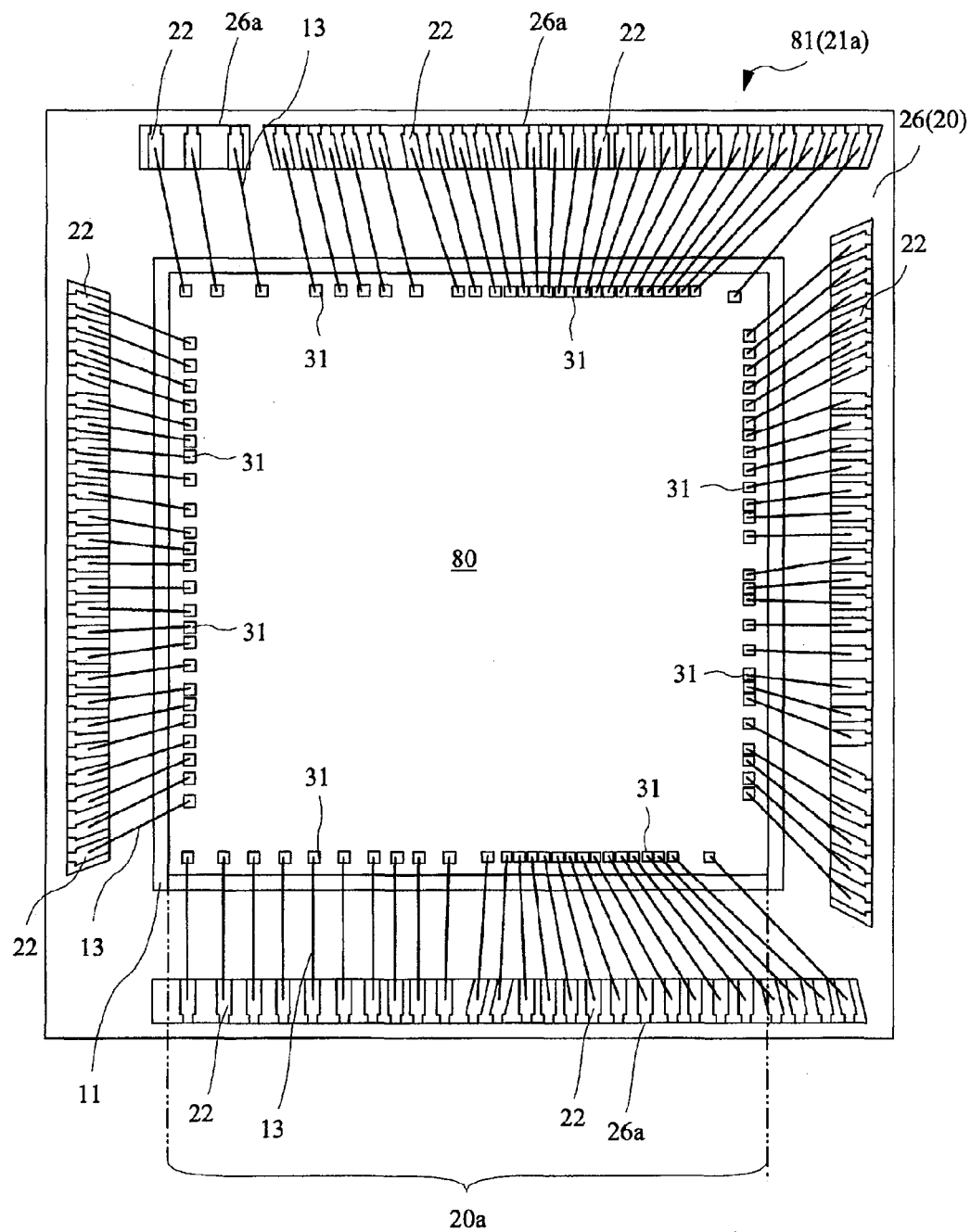
FIG. 27 is a planar view illustrating a modified example of FIG. 2.
Figure 28:
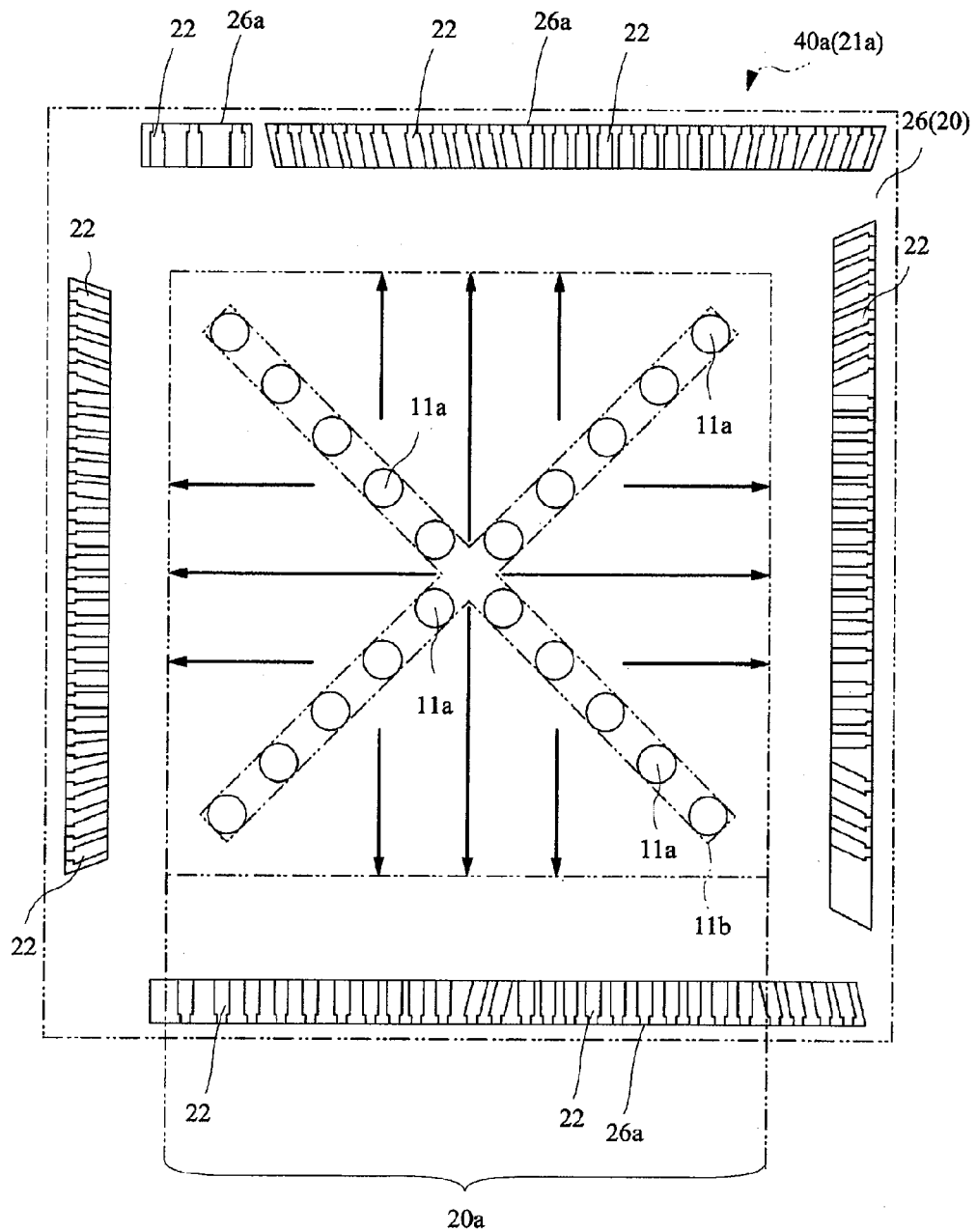
FIG. 28 is an enlarged planar view illustrating an adhesive material application step of the die bonding step in the method of manufacturing a semiconductor device shown in FIG. 27.

Although an example has been described in the above-mentioned embodiment in which the semiconductor chip 12 whose shape in plan view is comprised of a rectangle is mounted, it is also applicable to a semiconductor device 81 mounting a semiconductor chip 80 having a square planar shape as shown in FIG. 27. FIG. 27 is a planar view illustrating a modified example of FIG. 2. FIG. 28 is an enlarged planar view illustrating an adhesive material application step of the die bonding step in the method of manufacturing a semiconductor device shown in FIG. 27, and FIG. 29 is an explanatory view schematically illustrating an exemplary arrangement of a dummy wiring formed on the lower layer of the chip-mounting region shown in FIG. 28.

The semiconductor device 81 shown in FIG. 27 is a modified example of the semiconductor device 2 shown in FIG. 2 and differs from the semiconductor device 2 in that a single semiconductor chip 80 having a square planar shape is mounted on the chip-mounting region 20a of the wiring substrate 20. In addition, a difference lies in that the semiconductor device 81 does not have the groove 26b shown in FIG. 2 formed around the chip-mounting region 20a. The semiconductor chip 80 is a semiconductor chip formed by integrating the AFE chip 12a and the VDR chip 12b shown in FIG. 2.

When mounting the square-shaped semiconductor chip 80 on the wiring substrate, a method of applying the adhesive material paste 11a to the adhesive material application region 11b provided along the two diagonal lines binding respective corners of the chip-mounting region 20a (cross coating method), as shown in FIG. 28, is effective from the viewpoint of reducing the amount of application of the adhesive material paste 11a. When applying the adhesive material paste 11a according to the cross coating method, the adhesive material paste 11a is spread from the adhesive material application region 11b to each edge of the outer edge of the chip-mounting region 20a in the subsequent semiconductor chip-mounting step, as indicated by the arrow in FIG. 28.

Figure 29:
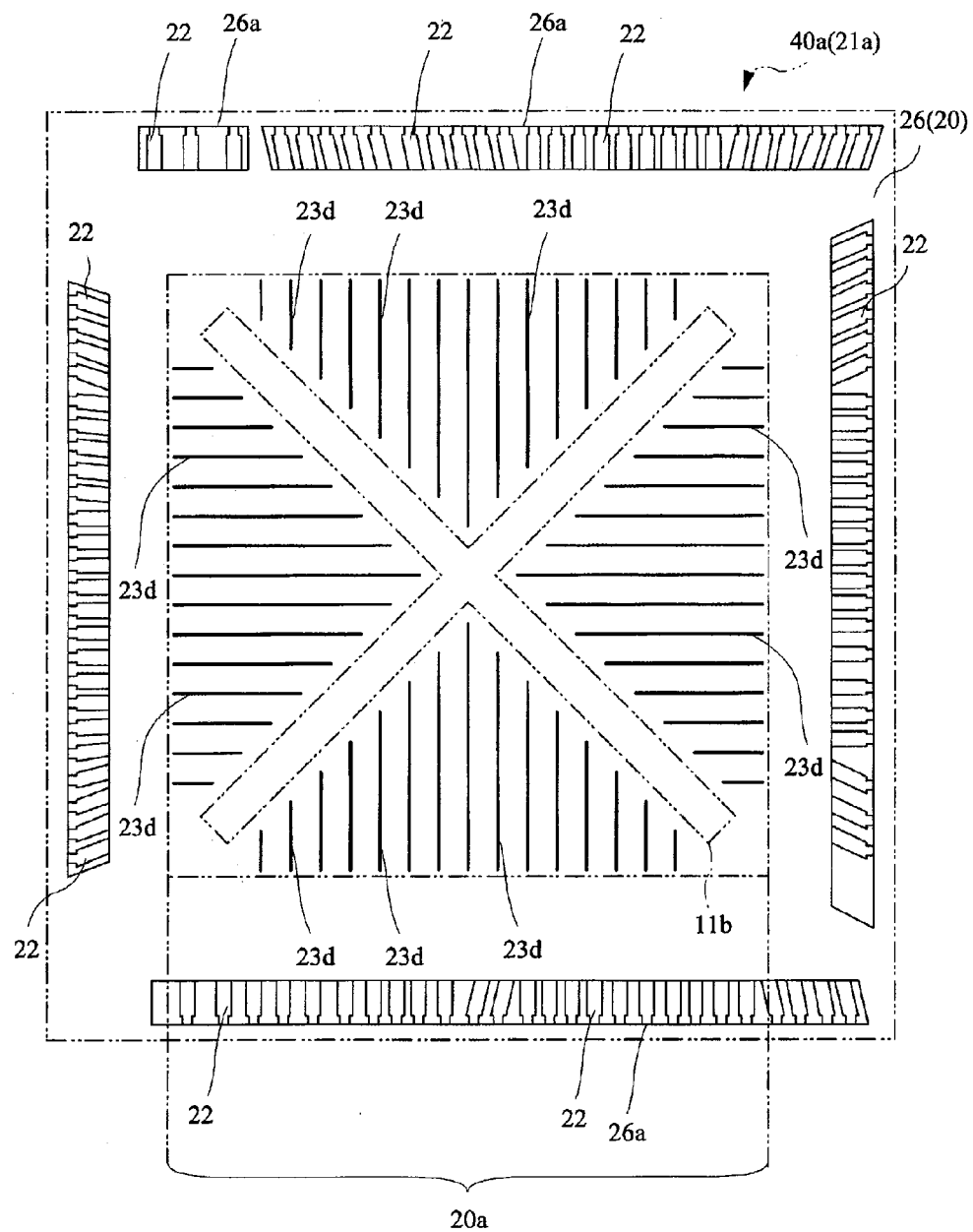
FIG. 29 is an explanatory view schematically illustrating an exemplary arrangement of a dummy wiring formed on the lower layer of the chip-mounting region shown in FIG. 28.

Therefore, in this modified example, occurrence of avoid can be suppressed by extending each of the dummy wirings 23d toward the nearest side from the adhesive material application region 11b, among the four sides of the chip-mounting region 20a, even if the amount of application of the adhesive material paste 11a is reduced as schematically shown in FIG. 29, for example. This is because the gas (e.g., air) existing between the semiconductor chip 80 (see FIG. 27) and the insulating film 26 can be easily pushed outside the chip-mounting region 20a by shortening the travel distance thereof. Although, in FIG. 29, illustration of the wirings 23a described in the above-mentioned embodiment is omitted, the lower layer of the chip-mounting region 20a (over the upper surface 21a of the core layer) has the wirings 23a (see FIG. 8) arranged thereon. Therefore, the dummy wirings 23d are selectively formed on a region where the distance between the wirings 23a is wide. Since the preferred aspect according to the shape and layout of the dummy wirings 23d has been described in <Description of shape and layout of dummy wirings of present embodiment> of the above-mentioned embodiment, duplicate description thereof is omitted.

Modified Example 5

Figure 30:
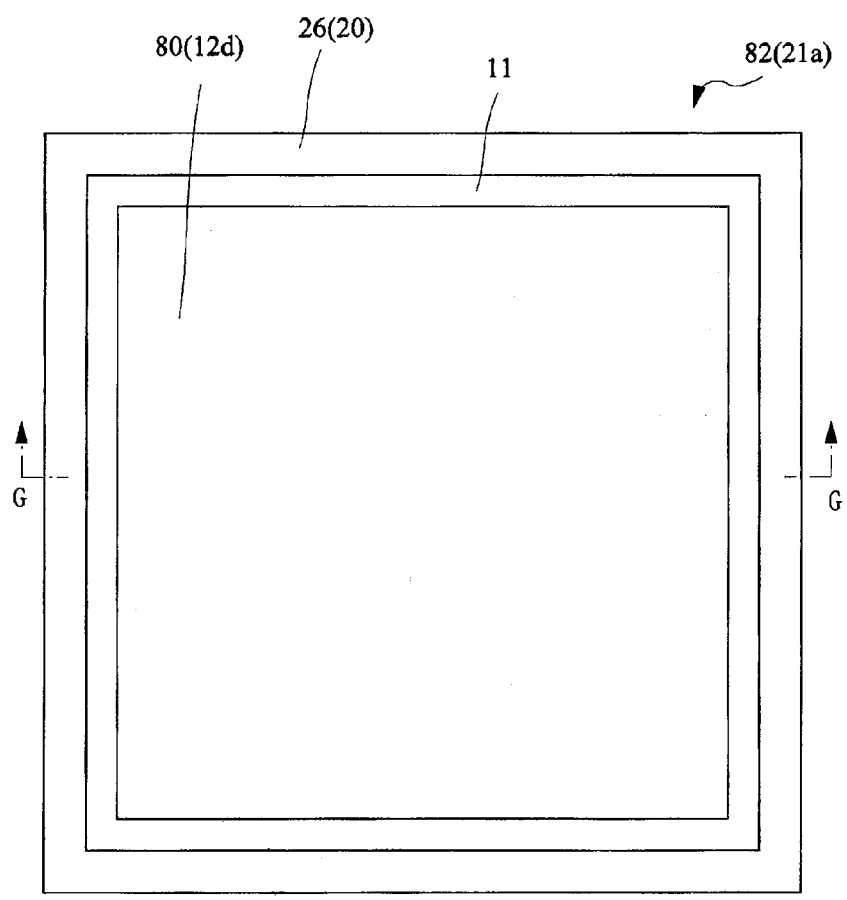
FIG. 30 is a planar view illustrating a modified example of FIG. 27.
Figure 31:
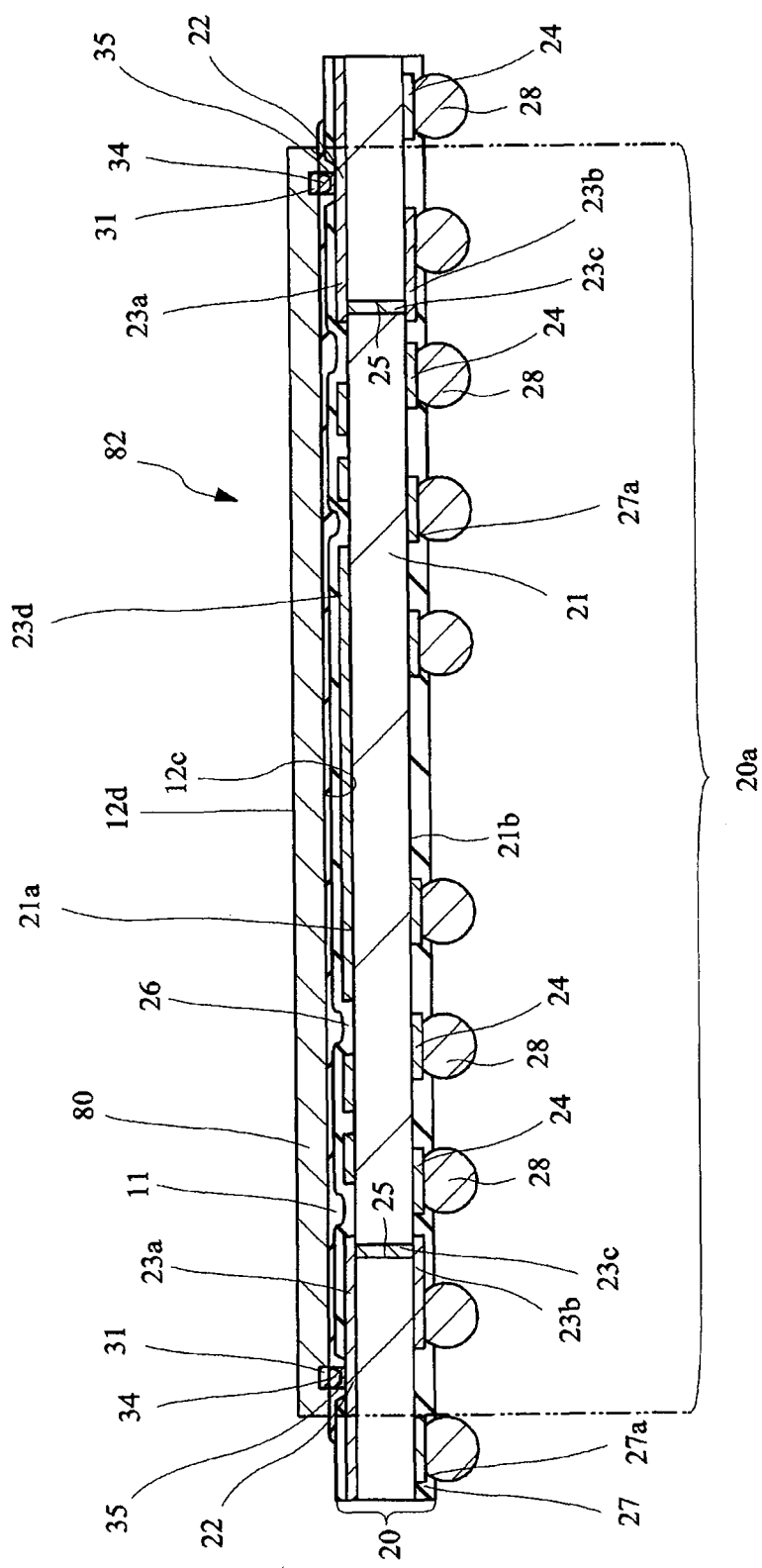
FIG. 31 is a cross sectional view taken along line G-G of FIG. 30.

Although an aspect has been described in the modified example 4 in which the semiconductor chip 80 is mounted according to the so-called face-up installation method, it can also be applied to the semiconductor device 82 having the semiconductor chip 80 mounted thereon according to a face-down installation method, as shown in FIGS. 30 and 31. FIG. 30 is a planar view illustrating a modified example of FIG. 27. FIG. 31 is a cross sectional view taken along line G-G of FIG. 30.

The semiconductor device 82 shown in FIGS. 30 and 31 is a modified example of the semiconductor device 81 shown in FIG. 27 and a difference lies in that it is mounted on the wiring substrate 20 so that the chip-mounting region 20a of the wiring substrate 20 and the surface 12c of the semiconductor chip 80 face each other. In other words, the semiconductor device 82 has the semiconductor chip 80 mounted thereon according to the face-down installation method (flip chip coupling method). As shown in FIG. 30, the face-down installation method is advantageous in terms of manufacturing thinner semiconductor devices because the sealing body 14 shown in FIG. 3 need not be formed on the rear surface 12d. In addition, since the rear surface 12d is exposed, increase of the total thickness can be suppressed when another semiconductor chip or another semiconductor device is further laminated on the rear surface 12d.

With the face-down installation method, as shown in FIG. 31, the terminals 22 of the wiring substrate 20 are formed on the chip-mounting region 20a, and the pads 31 and the terminals 22 of the semiconductor chip 80 are electrically coupled via bump electrodes 34 formed on the pads 31. Specifically, a joining member such as the solder material 35 formed on the terminals 22 and the bump electrodes 34 made of gold, for example, are joined by gold-to-solder joining. As for such a joining method, a method of relaxing the stress by inserting underfill resin between the surface 12c of the semiconductor chip 80 and the wiring substrate 20 (specifically, the insulating film 26) is effective from the viewpoint of avoiding contact failure due to concentration of stress at the joint of the pad 31 and the terminals 22.

In order to expose the rear surface 12d of semiconductor chip 80, however, it is necessary to reduce the amount of underfill resin from the viewpoint of preventing the underfill resin form going around to the rear surface 12d of the semiconductor chip 80. Generally, in the step of filling the underfill resin, although the underfill resin is filled between the semiconductor chip 80 and the wiring substrate 20 after the pads 31 and the terminals 22 are joined, static pressure at the time of filling becomes large due to the narrow gap between the semiconductor chip 80 and the wiring substrate 20 if the amount of the underfill resin is small, which may cause occurrence of a void. If a void occurs in the underfill resin, balance of the stress relaxation is lost and stress is concentrated on the joint between the pad 31 and the terminal 22, which may cause joint failure.

From the viewpoint of preventing occurrence of a void in the underfill resin, therefore, application of the technology described in the die bonding step of the above-mentioned embodiment is effective. In other words, occurrence of a void can be prevented or suppressed by using the adhesive material 11 and the adhesive material paste 11a described in the modified examples 1 to 4 as the underfill resin. Since the preferred aspect according to the shape and layout of the dummy wirings 23d has been described in <Description of shape and layout of dummy wirings of present embodiment> of the above-mentioned embodiment, duplicate description thereof is omitted.

The present invention is applicable to a semiconductor device having semiconductor chips mounted on a wiring substrate.

What is claimed is:

1. A method of manufacturing a semiconductor device comprising the steps of:
   (a) providing a wiring substrate including a core layer having an upper surface and a lower surface opposite to the upper surface, a plurality of first and second wirings formed on the upper surface of the core layer, a plurality of bonding leads formed on the upper surface of the core layer and electrically coupled to the first wirings, an upper surface-side insulating film formed on the upper surface of the core layer such that the first and second wirings are covered, and such that the bonding leads are exposed, a plurality of lands formed on the lower surface of the core layer and electrically coupled to the bonding leads respectively, and a lower surface-side insulating film formed on the lower surface of the core layer such that the lands are exposed;
   (b) applying a first flowable adhesive material to a first adhesive material application region in a first chip-mounting region, a shape in a plan view of the first adhesive material application region is rectangular, the first chip-mounting region being provided over the upper surface of the core layer; and
   (c) mounting a first semiconductor chip, having a first front surface, a plurality of first electrode pads formed on the first front surface, and a first rear surface opposite to the first front surface, in the first chip-mounting region of the wiring substrate via the first adhesive material, and spreading the first adhesive material around the first adhesive material application region, a shape in the plan view of the first semiconductor chip is rectangular,
   wherein the first chip-mounting region has the first and second wirings, wherein in the step (b), the first adhesive material is applied to the first adhesive material application region provided on a first centerline connecting each center of two short sides facing each other in the first chip-mounting region, and extending along the first centerline, and wherein each of the second wirings is extended along a direction in which the first adhesive material spreads in the step (c).

2. The method of manufacturing a semiconductor device according to claim 1,
wherein each of the second wirings is not coupled to the first wirings and the bonding leads.

3. The method of manufacturing a semiconductor device according to claim 2,
wherein each of the second wirings is extended along the short side of the first chip-mounting region.

4. The method of manufacturing a semiconductor device according to claim 3,
wherein the thickness of each of the second wirings is equal to that of each of the first wirings.

5. The method of manufacturing a semiconductor device according to claim 4,
wherein the wiring substrate has, in the upper surface of the core layer and in the lower layer of the first chip-mounting region, a second wiring arrangement region on which the second wiring is formed and a second wiring non-arrangement region on which the second wiring is not formed, and the distance between the adjacent first wirings in the second wiring arrangement region is larger than that between the adjacent first wirings in the second wiring non-arrangement region.

6. The method of manufacturing a semiconductor device according to claim 5,
wherein other ones of the second wirings are not adjacently arranged on the extension line of the extending direction of each of the second wirings.

7. The method of manufacturing a semiconductor device according to claim 1,
wherein some of the second wirings have a bent portion.

8. The method of manufacturing a semiconductor device according to claim 1,
wherein the some of the second wirings are extended toward the short side of the first chip-mounting region respectively.

9. The method of manufacturing a semiconductor device according to claim 1,
wherein the second wirings are arranged in the first chip-mounting region in a planar view, and are not extended to the outside of the first chip-mounting region.

10. The method of manufacturing a semiconductor device according to claim 1,
wherein in the step (c), the first semiconductor chip is mounted, so that the first rear surface of the first semiconductor chip and the first chip-mounting region of the wiring substrate face each other.

11. The method of manufacturing a semiconductor device according to claim 1,
wherein in the step (b), the first adhesive material is applied, to a plurality of positions in the first adhesive material application region.

12. The method of manufacturing a semiconductor device according to claim 1,
wherein the wiring substrate provided in the step (a) includes a second chip-mounting region having a rectangular planar shape and provided on the upper surface side of the core layer, one of long sides of the four sides of the second chip-mounting region and one of long sides of the four sides of the first chip-mounting region are laid side by side so as to face each other, wherein the method further comprises the steps of:

(d) applying a second adhesive material over the second chip-mounting region; and (e) mounting a second semiconductor chip whose shape in plan view is comprised of a rectangle and which has a second surface, a plurality of second electrode pads formed on the second surface, and a second rear surface opposite to the second surface over the second chip-mounting region of the wiring substrate via the second adhesive material, and wherein the step (c) is performed after the step (e).

13. The method of manufacturing a semiconductor device according to claim 12,
wherein the wiring substrate provided in the step (a) has the first and second wirings formed on the lower layer of the second chip-mounting region, and in step (d), the second adhesive material is applied to the second adhesive material application region which is provided on the second centerline connecting each of the centers of the short sides facing each other among the four sides of the second chip-mounting region and extended along the second centerline, and the step (e) includes the step of spreading the second adhesive material applied in the step (d) around the second adhesive material application region, and each of the second wirings laid in the lower layer of the second chip-mounting region is extended along a direction in which the first adhesive material spreads in the step (e).

14. A method of manufacturing a semiconductor device comprising the steps of:
(a) providing a wiring substrate including, a core layer having an upper surface and a lower surface opposite to the upper surface, a plurality of first and second wirings formed on the upper surface of the core layer, a plurality of bonding leads formed on the upper surface of the core layer and electrically coupled to the first wirings, an upper surface-side insulating film formed on the upper surface of the core layer such that the first and second wirings are covered, and such that the bonding leads are exposed, a plurality of lands formed on the lower surface of the core layer and electrically coupled to the bonding leads respectively, and a lower surface-side insulating film formed on the lower surface of the core layer such that the lands are exposed;

(b) applying a flowable adhesive material to an adhesive material application region in a chip-mounting region which is provided on the upper surface side of the core layer, a shape in a plan view of the adhesive material application region is quadrangular; and (c) mounting, over the chip-mounting region of the wiring substrate via the adhesive material, a semiconductor chip having a surface, a plurality of electrode pads formed on the surface, and a rear surface opposite to the surface, and spreading the adhesive material around the adhesive material application region, a shape in the plan view of the semiconductor chip is quadrangular, wherein the chip-mounting region has the first and second wirings, and wherein each of the second wirings is extended toward a nearest side of the chip-mounting region, among four sides of the chip-mounting region, from a side of the adhesive material application region.

* * * * *